US007813086B2

(12) United States Patent
Tanaka et al.

(10) Patent No.: US 7,813,086 B2
(45) Date of Patent: Oct. 12, 2010

(54) THIN FILM MAGNETIC HEAD COMPRISING METAL LAYER AND HAVING IMPROVED ASYMMETRY CHARACTERISTIC AND METHOD OF PRODUCING THE SAME

(75) Inventors: Kosuke Tanaka, Tokyo (JP); Kazuki Sato, Tokyo (JP); Eiji Komura, Tokyo (JP)

(73) Assignee: TDK Corporation, Tokyo (JP)

( * ) Notice: Subject to any disclaimer, the term of this patent is extended or adjusted under 35 U.S.C. 154(b) by 764 days.

(21) Appl. No.: 11/802,220

(22) Filed: May 21, 2007

(65) Prior Publication Data

US 2008/0291583 A1 Nov. 27, 2008

(51) Int. Cl.
*G11B 5/39* (2006.01)
(52) U.S. Cl. .............................. 360/324.1; 360/324.12
(58) Field of Classification Search .............. 360/324.1, 360/321.11, 324.12, 324.2, 319; 428/811.2
See application file for complete search history.

(56) References Cited

U.S. PATENT DOCUMENTS

| | | | |
|---|---|---|---|
| 7,623,324 B2* | 11/2009 | Honda et al. | 360/324.12 |
| 7,663,847 B2* | 2/2010 | Freitag et al. | 360/324.12 |
| 2005/0195536 A1 | 9/2005 | Kagami et al. | |
| 2006/0067010 A1 | 3/2006 | Kagami et al. | |
| 2006/0132989 A1* | 6/2006 | Zhang et al. | 360/324.12 |
| 2006/0158793 A1* | 7/2006 | Arasawa et al. | 360/324.12 |
| 2006/0285259 A1* | 12/2006 | Gill et al. | 360/324.12 |

FOREIGN PATENT DOCUMENTS

| | | |
|---|---|---|
| JP | A-10-049829 | 2/1998 |
| JP | A-2005-135514 | 5/2005 |
| JP | A-2005-251254 | 9/2005 |

\* cited by examiner

*Primary Examiner*—Jefferson Evans
(74) *Attorney, Agent, or Firm*—Oliff & Berridge, PLC

(57) ABSTRACT

Producing a thin film magnetic head includes forming a pair of openings in a predetermined region of a TMR layer formed on a lower magnetic shield layer; forming a pair of bias-applying layers in the pair of openings so that an upper surface thereof is located above an upper surface of the TMR layer; laminating a metal layer that covers the upper surface of a portion located between the pair of bias-applying layers in the TMR layer and the upper surface of the pair of bias-applying layers; forming a resist layer across the upper surface of a portion located above the pair of bias-applying layers in the metal layer and the upper surface of a portion located above the TMR layer in the metal layer; and etching a part of the TMR layer and a part of the pair of bias-applying layers with the resist layer being as a mask.

16 Claims, 14 Drawing Sheets

Fig.5
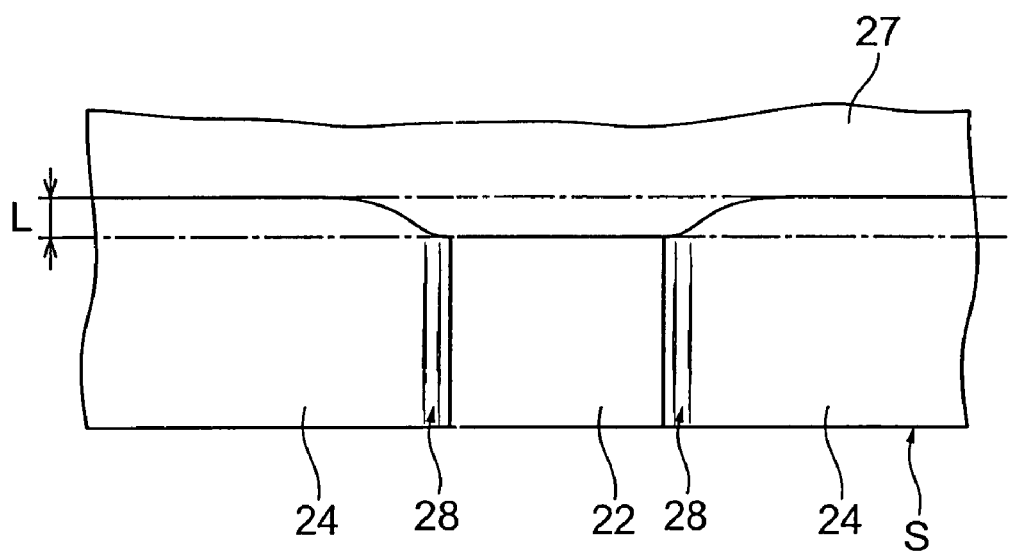
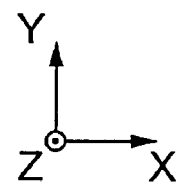

Fig.7
(a)
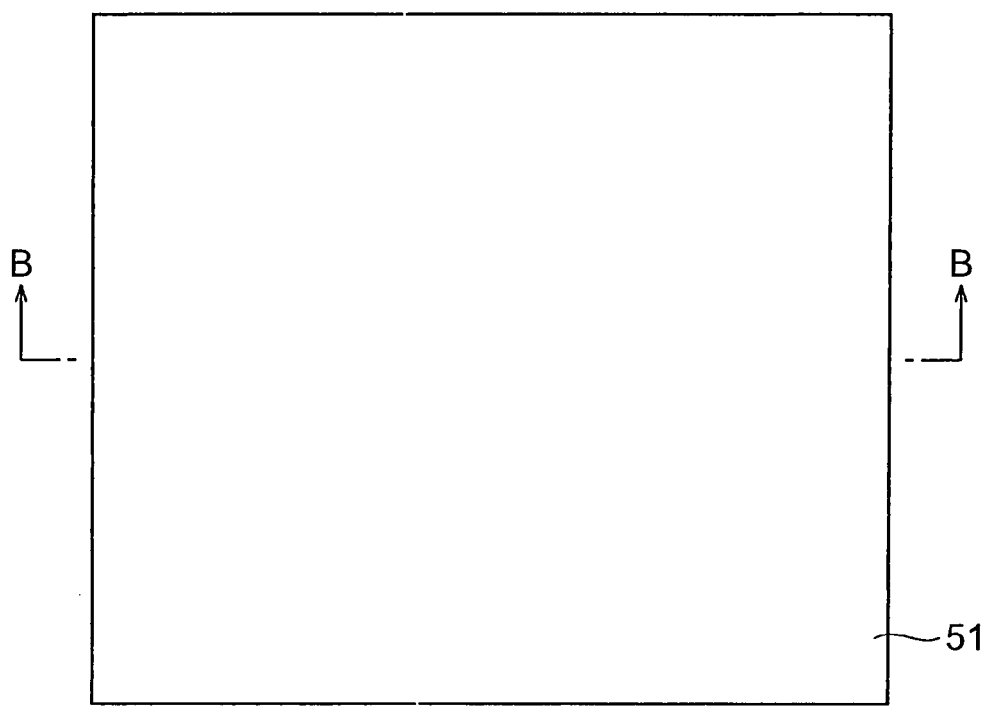
(b)
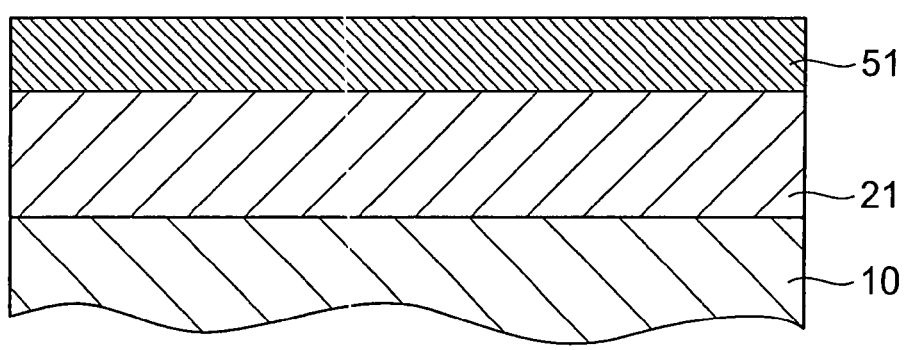

Fig.8
(a)
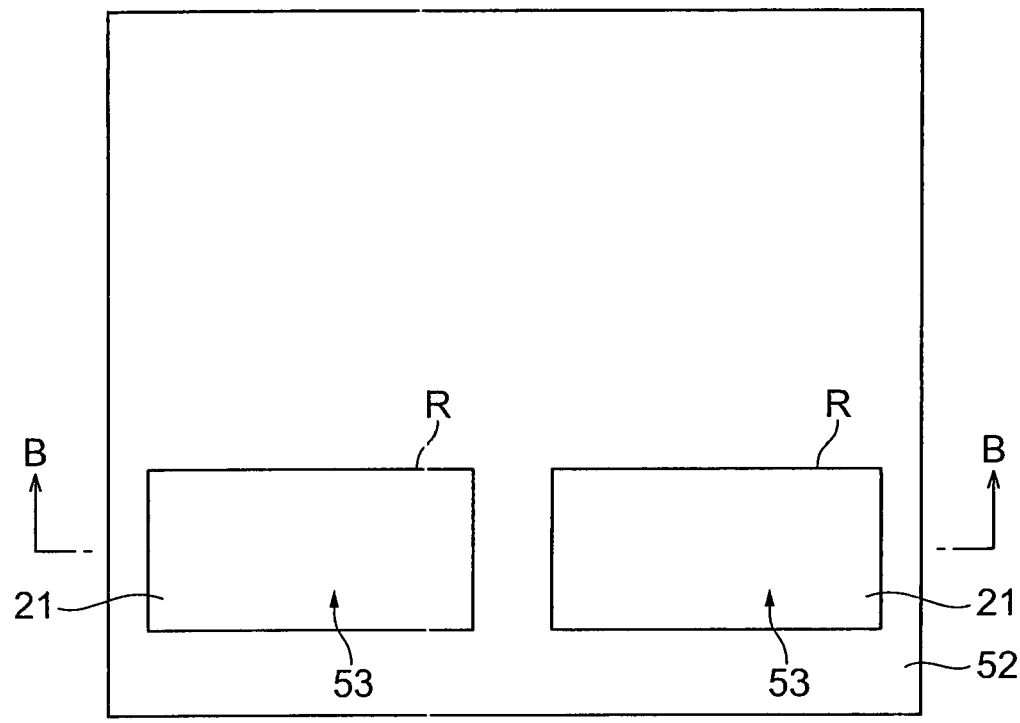
(b)
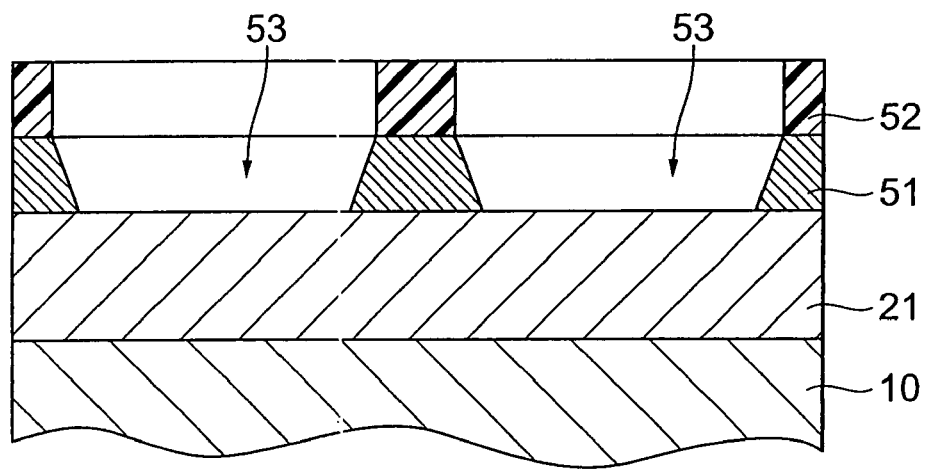

Fig.9
(a)
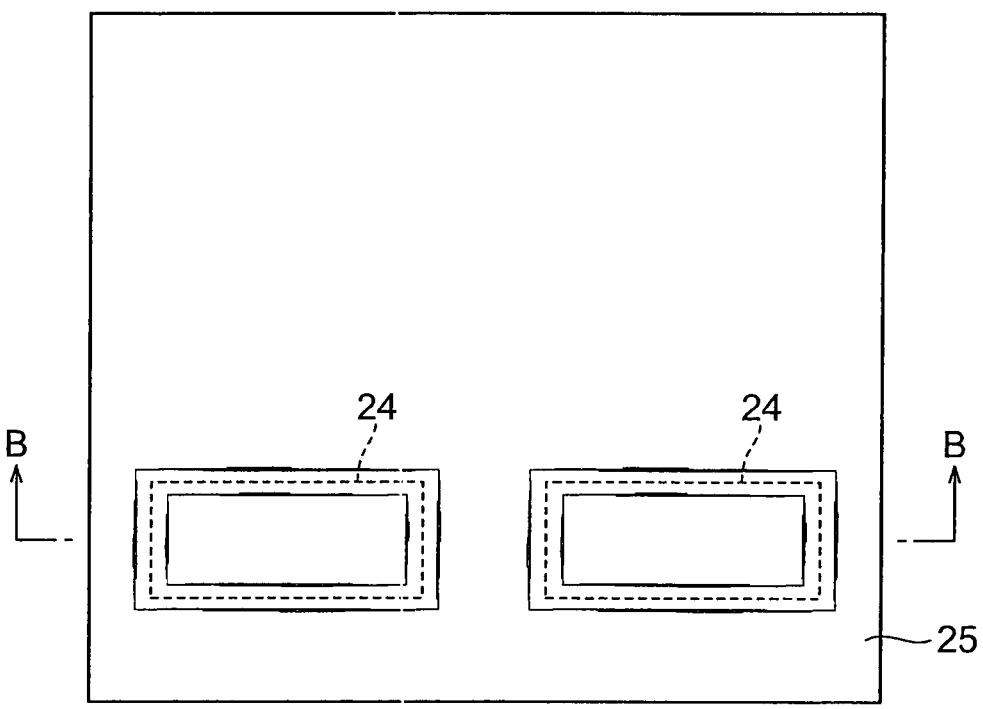
(b)
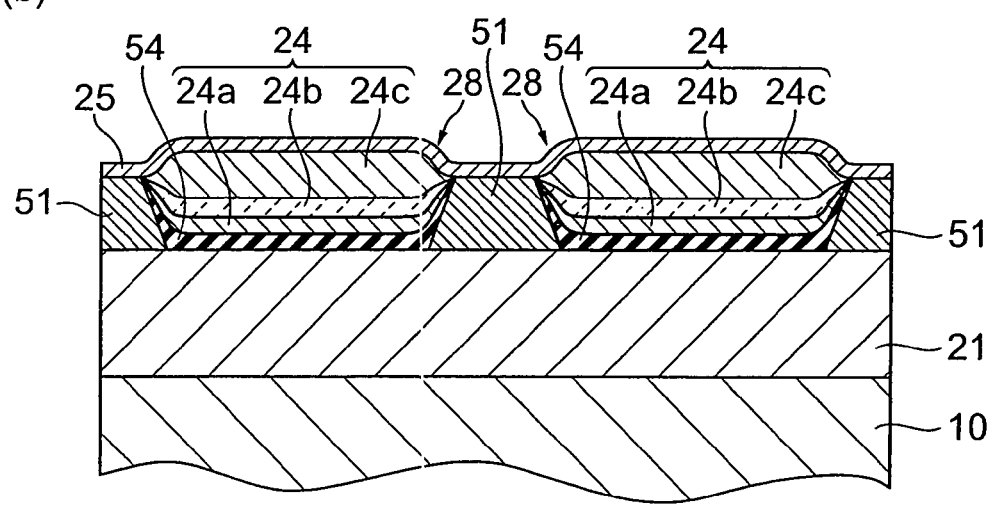

Fig.10
(a)
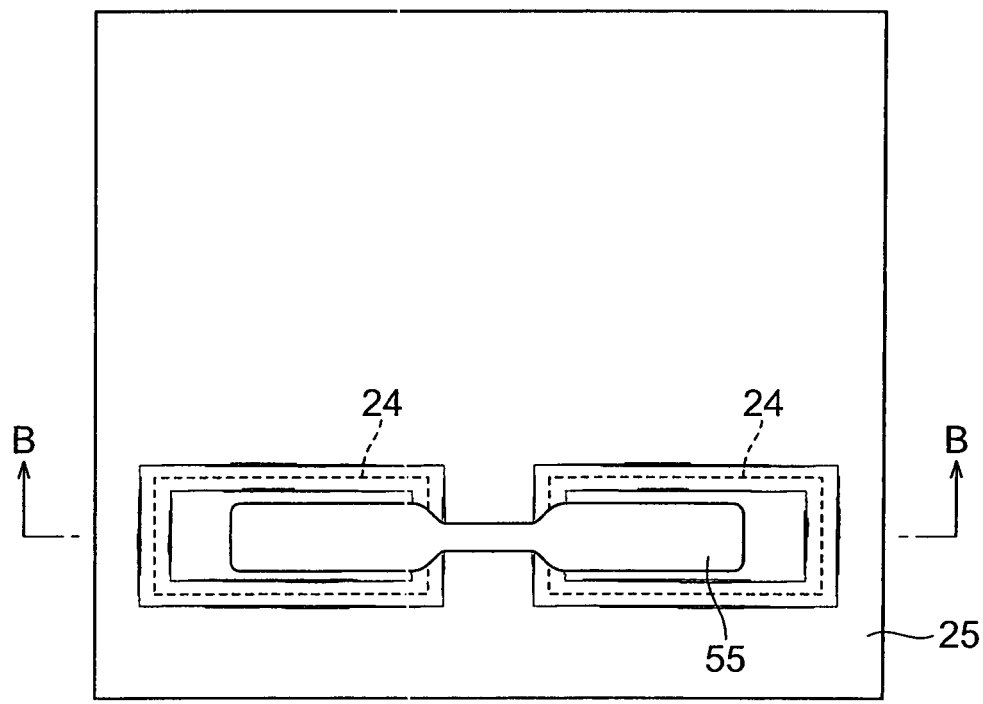
(b)
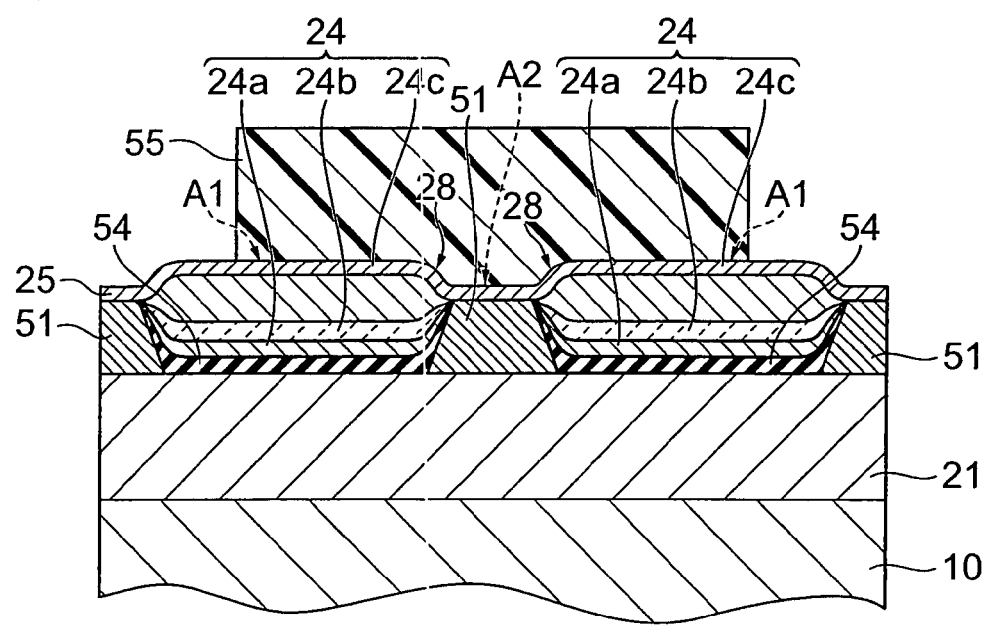

Fig.11
(a)
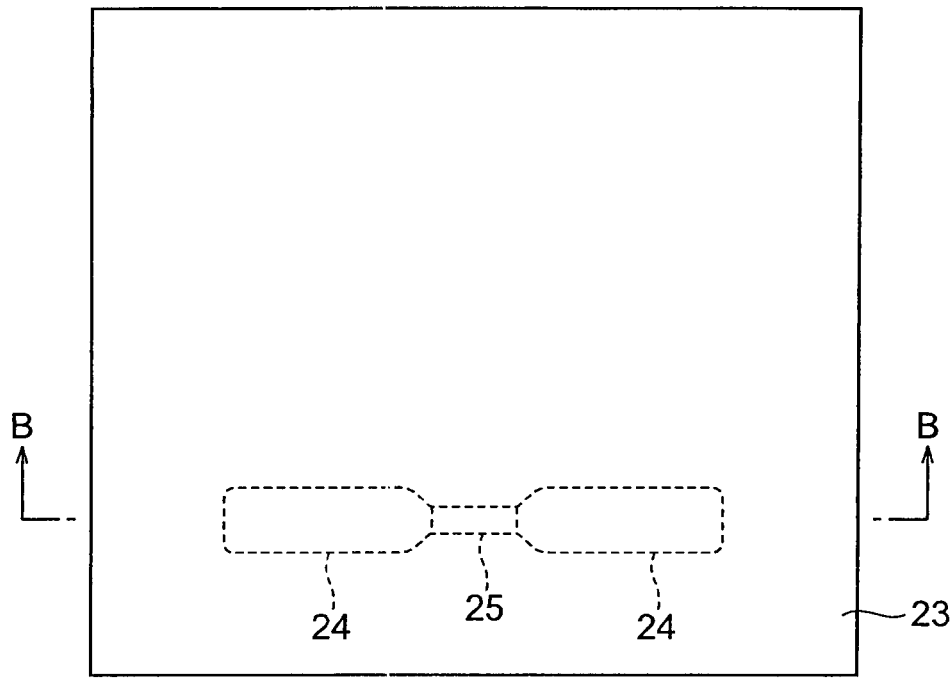
(b)
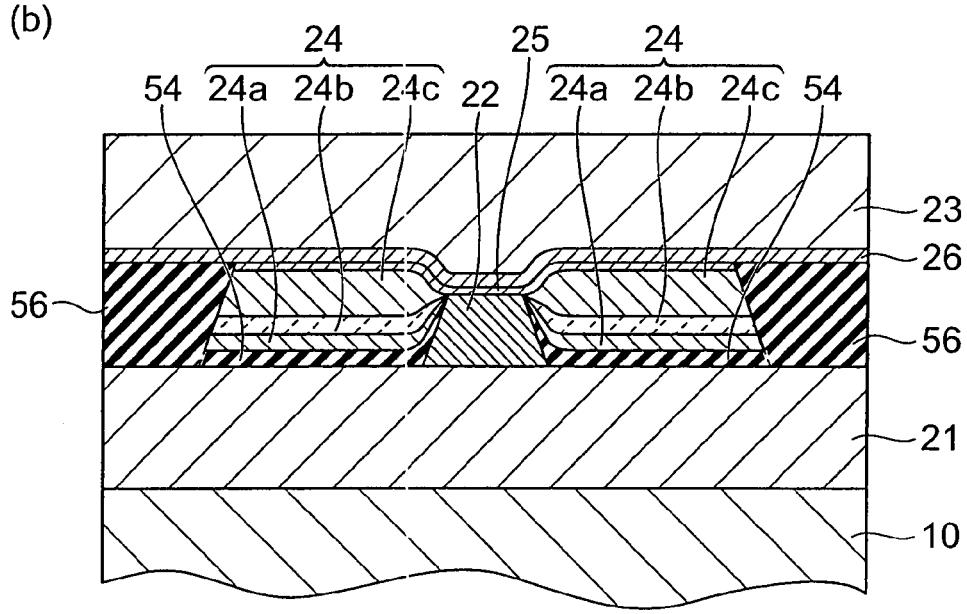

Fig.12

| MATERIAL FOR FORMING THE METAL LAYER | MAGNITUDE D OF THE STEP | | | | |
|---|---|---|---|---|---|
| | 0nm | 10nm | 20nm | 30nm | 40nm |
| Al (REFLECTIVITY R:0.892) | AMOUNT OF CONSTRICTION L:16nm | AMOUNT OF CONSTRICTION L:39nm | AMOUNT OF CONSTRICTION L:53.6nm | AMOUNT OF CONSTRICTION L:64.8nm | AMOUNT OF CONSTRICTION L:66.9nm |
| Ru (REFLECTIVITY R:0.595) | AMOUNT OF CONSTRICTION L:12nm | AMOUNT OF CONSTRICTION L:25.7nm | AMOUNT OF CONSTRICTION L:44nm | AMOUNT OF CONSTRICTION L:48nm | AMOUNT OF CONSTRICTION L:49.1nm |
| Mo (REFLECTIVITY R:0.428) | AMOUNT OF CONSTRICTION L:8.5nm | AMOUNT OF CONSTRICTION L:20.5nm | AMOUNT OF CONSTRICTION L:32nm | AMOUNT OF CONSTRICTION L:36.5nm | AMOUNT OF CONSTRICTION L:37.2nm |
| NiCr (REFLECTIVITY R:0.333) | AMOUNT OF CONSTRICTION L:3.2nm | AMOUNT OF CONSTRICTION L:17nm | AMOUNT OF CONSTRICTION L:24.3nm | AMOUNT OF CONSTRICTION L:30nm | AMOUNT OF CONSTRICTION L:30.3nm |
| W (REFLECTIVITY R:0.323) | AMOUNT OF CONSTRICTION L:3.6nm | AMOUNT OF CONSTRICTION L:14nm | AMOUNT OF CONSTRICTION L:26nm | AMOUNT OF CONSTRICTION L:28.8nm | AMOUNT OF CONSTRICTION L:30.7nm |
| Ta (REFLECTIVITY R:0.251) | AMOUNT OF CONSTRICTION L:-0.9nm | AMOUNT OF CONSTRICTION L:5.3nm | AMOUNT OF CONSTRICTION L:13.1nm | AMOUNT OF CONSTRICTION L:16.4nm | AMOUNT OF CONSTRICTION L:22.9nm |
| Ti (REFLECTIVITY R:0.232) | AMOUNT OF CONSTRICTION L:1.6nm | AMOUNT OF CONSTRICTION L:3.9nm | AMOUNT OF CONSTRICTION L:10.2nm | AMOUNT OF CONSTRICTION L:17.7nm | AMOUNT OF CONSTRICTION L:21.7nm |
| Ag (REFLECTIVITY R:0.173) | AMOUNT OF CONSTRICTION L:-1.2nm | AMOUNT OF CONSTRICTION L:-0.9nm | AMOUNT OF CONSTRICTION L:3.2nm | AMOUNT OF CONSTRICTION L:9.4nm | AMOUNT OF CONSTRICTION L:12nm |

THIN FILM MAGNETIC HEAD COMPRISING METAL LAYER AND HAVING IMPROVED ASYMMETRY CHARACTERISTIC AND METHOD OF PRODUCING THE SAME

BACKGROUND OF THE INVENTION

1. Field of the Invention

The present invention relates to a thin film magnetic head comprising a metal layer and a method of producing the same.

2. Related Background of the Invention

In order to achieve an improvement in asymmetry characteristic (output amplitude asymmetry), it is effective to align the magnetization direction of a free layer by a bias-applying layer in a uniform direction.

For this reason, there is conventionally known a thin film magnetic head comprising a magneto-resistance effect element having a free layer, and a pair of bias-applying layers for applying a bias magnetic field to the free layer, wherein the pair of bias-applying layers has the magneto-resistance effect element therebetween and is arranged side by side in the track width direction, and the width of the bias-applying layer in the depth direction relative to a medium facing surface is set larger than that of the free layer in the depth direction relative to the medium facing surface (for example, see Japanese Patent Application Laid-Open No. 10-049829).

SUMMARY OF THE INVENTION

However, in order to set the width of the bias-applying layer in the depth direction relative to the medium facing surface larger than that of the free layer in the depth direction relative to the medium facing surface, the alignment of masks needs to be carried out with extremely high accuracy or a hard layer that is difficult to be ion milled needs to be provided on the bias-applying layer during the production process. This increased the number of process steps for producing the conventional thin film magnetic head.

Then, the present invention is intended to provide a thin film magnetic head and method of producing the same capable of achieving an improvement in the asymmetry characteristic without increasing the number of process steps.

A method of producing a thin film magnetic head concerning the present invention comprises the steps of: forming a lower magnetic shield layer on a base; forming a magneto-resistance effect layer on the lower magnetic shield layer; forming a pair of openings in a predetermined region of the magneto-resistance effect layer; forming a pair of bias-applying layers in the pair of openings so that an upper surface thereof may be located above an upper surface of the magneto-resistance effect layer; forming; a metal layer group by laminating at least one metal layer, which covers an upper surface of a portion located between the pair of bias-applying layers in the magneto-resistance effect layer and an upper surface of the pair of bias-applying layers; forming a resist layer across the upper surface of a portion located above the pair of bias-applying layers of the metal layer group and the upper surface of a portion located above the magneto-resistance effect layer of the metal layer group; etching a part of the magneto-resistance effect layer and a part of the pair of bias-applying layers with the resist layer being as a mask; forming an insulating layer in a state where the resist layer remains; and forming an upper magnetic shield layer after removing the resist layer: wherein reflectivity $R_1$ for an incident light having a wavelength of 248 nm, the reflectivity being obtained by dividing a total value of a reflected light flux from each metal layer constituting the metal layer group at an interface between the metal layer group and the resist layer by a value of an incident light flux at the interface between the metal layer group and the resist layer, is set so as to satisfy a condition represented by the following formula (1); and wherein a magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set so as to satisfy the condition represented by the following formula (2).

$$R_1 \geq 0.2 \tag{1}$$

$$D \geq 210\exp(-7.6R_1) \text{ [nm]} \tag{2}$$

In the method of producing a thin film magnetic head concerning the present invention, a pair of bias-applying layers is formed in a pair of openings so that the upper surface thereof may be located above the upper surface of the magneto-resistance effect layer. This provides a step portion between the pair of bias-applying layers and the magneto-resistance effect layer. When, in order to determine the width of the bias-applying layer and the width of the magneto-resistance effect element in the depth direction relative to the medium facing surface, a resist is applied above the pair of bias-applying layers and the magneto-resistance effect layer and then this resist is exposed over the pair of bias-applying layers and the magneto-resistance effect layer, a reflected light is reflected toward the direction along the incident direction of an incident light in portions other than the step portion, so that the resist formed in the portions other than the step portion is exposed sufficiently. However, in the step portion, the reflected light is reflected toward directions completely different from the incident direction of the incident light, so that the resist formed in the step portion is exposed insufficiently. Accordingly, development of the exposed resist can give a resist layer, wherein the width of the portion located above the bias-applying layer in the depth direction relative to the medium facing surface is larger than that of the portion located above the magneto-resistance effect layer in the depth direction relative to the medium facing surface, as seen from the above. As a result, by etching a part of the magneto-resistance effect layer and a part of the pair of bias-applying layers with such resist layer being as a mask, a thin film magnetic head, wherein the width of the bias-applying layer in the depth direction relative to the medium facing surface is larger than that of the magneto-resistance effect element in the depth direction relative to the medium facing surface, can be produced, and it is therefore possible to achieve an improvement in the asymmetry characteristic without increasing the number of process steps.

In particular, the method of producing a thin film magnetic head concerning the present invention includes a step of forming a metal layer group by laminating at least one metal layer, which covers an upper surface of a portion located between the pair of bias-applying layers in the magneto-resistance effect layer and an upper surface of the pair of bias-applying layers, wherein the reflectivity $R_1$ is set so as to satisfy the condition represented by the above formula (1) and also the magnitude D of the step is set so as to satisfy the condition represented by the above formula (2). If the difference between the width of the bias-applying layer in the depth direction relative to the medium facing surface and that of the magneto-resistance effect element in the depth direction relative to the medium facing surface is not less than 20 nm, it is possible to sufficiently reduce the variation in the asymmetry characteristic, however if the reflectivity $R_1$ and the magnitude D of the step do not satisfy the above formulas (1) and (2), the difference between the width of the bias-applying layer in the depth direction relative to the medium facing surface and that of the magneto-resistance effect element in the depth direction relative to the medium facing surface tends to be smaller than 20 nm.

Moreover, it is preferable that the magnitude D of the step be set so as to further satisfy the condition that the magnitude D is not more than ½ of a direct distance between the upper magnetic shield layer and the lower magnetic shield layer. If the magnitude D of the step is larger than ½ of the direct distance between the upper magnetic shield layer and the lower magnetic shield layer, the step in the step portion provided between the pair of bias-applying layers and the magneto-resistance effect element becomes extremely large and thus the shape of the upper magnetic shield layer formed above the pair of bias-applying layers and the magneto-resistance effect element results in a distortion, so that the function as shield tends not to be exerted sufficiently in the upper magnetic shield layer.

Moreover, it is preferable that the magnitude D of the step be set so as to further satisfy the condition represented by the following formula (3).

$$D \leq 45 \text{ [nm]} \quad (3)$$

If the magnitude D of the step does not satisfy the condition represented by the above formula (3), the step in the step portion provided between the pair of bias-applying layers and the magneto-resistance effect element becomes extremely large and thus the shape of the upper magnetic shield layer formed above the pair of bias-applying layers and the magneto-resistance effect element results in a distortion, so that the function as shield tends not to be exerted sufficiently in the upper magnetic shield layer.

Moreover, it is preferable that the magnitude D of the step be set so as to further satisfy the condition represented by the following formula (4).

$$D \leq 20 \text{ [nm]} \quad (4)$$

If the magnitude D of the step satisfies the condition represented by the above formula (4), it is possible to achieve an improvement in the asymmetry characteristic while exerting the function as shield sufficiently in the upper magnetic shield layer.

Moreover, it is preferable that the reflectivity $R_1$ be set so as to further satisfy the condition represented by the following formula (5).

$$R_1 \geq 0.3 \quad (5)$$

Moreover, it is preferable that the reflectivity $R_2$ for the incident light having a wavelength of 248 nm at the interface between a metal layer located on the uppermost part of the metal layer group and the resist layer be set so as to satisfy the condition represented by the following formula (6) and also the magnitude D of the step, which is a direct distance between a virtual plane including the upper surface of a portion located above the pair of bias-applying layers of the metal layer group and a virtual plane including the upper surface of a portion located above the magneto-resistance effect element of the metal layer group, is set so as to satisfy the condition represented by the following formula (7).

$$R_2 \geq 0.2 \quad (6)$$

$$D \geq 210 \exp(-7.6 R_2) \text{ [nm]} \quad (7)$$

If the difference between the width of the bias-applying layer in the depth direction relative to the medium facing surface and that of the magneto-resistance effect element in the depth direction relative to the medium facing surface is not less than 20 nm, it is possible to sufficiently reduce the variation in the asymmetry characteristic, and if the reflectivity $R_2$ and the magnitude D of the step satisfy the above formulas (6) and (7), the difference between the width of the bias-applying layer in the depth direction relative to the medium facing surface and that of the magneto-resistance effect element in the depth direction relative to the medium facing surface is easily made larger than 20 nm.

Moreover, it is preferable that the resist layer has the refractive index of 1.6 to 1.8 for the incident light with a wavelength of 248 nm and the absorption coefficient of 0 to 0.001.

Moreover, the method of producing a thin film magnetic head concerning the present invention comprises the steps of: forming a lower magnetic shield layer on a base; forming a magneto-resistance effect layer on the lower magnetic shield layer; forming a pair of openings in a predetermined region of the magneto-resistance effect layer; forming a pair of bias-applying layers in the pair of openings so that an upper surface thereof may be located above an upper surface of the magneto-resistance effect layer; forming a metal layer group by laminating at least one metal layer, which covers an upper surface of a portion located between the pair of bias-applying layers in the magneto-resistance effect layer and an upper surface of the pair of bias-applying layers; forming a resist layer across the upper surface of a portion located above the pair of bias-applying layers of the metal layer group and the upper surface of a portion located above the magneto-resistance effect layer of the metal layer group; etching a part of the magneto-resistance effect layer and a part of the pair of bias-applying layers with the resist layer being as a mask; forming an insulating layer in a state where the resist layer remains; and forming an upper magnetic shield layer after removing the resist layer: wherein a metal layer located on the uppermost part of the metal layer group is comprised of Ti and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 36.0 nm; or wherein a metal layer located on the uppermost part of the metal layer group is comprised of Ta and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 31.2 nm; or wherein a metal layer located on the uppermost part of the metal layer group is comprised of W and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 18.0 nm; or wherein a metal layer located on the uppermost part of the metal layer group is comprised of NiCr and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 16.7 nm; or wherein a metal layer located on the uppermost part of the metal layer group is comprised of Mo and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 8.1 nm; or wherein a metal layer located on the uppermost part of the metal layer group is comprised of Ru and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 2.3 nm; or wherein a metal layer located on the uppermost part of the metal layer group is comprised of Al and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 0.2 nm.

In the method of producing a thin film magnetic head concerning the present invention, a pair of bias-applying layers is formed in a pair of openings so that the upper surface thereof may be located above the upper surface of the magneto-resistance effect layer. This provides a step portion between the pair of bias-applying layers and the magneto-resistance effect layer. When, in order to determine the width of the bias-applying layer and the width of the magneto-resistance effect element in the depth direction relative to the medium facing surface, a resist is applied above the pair of bias-applying layers and the magneto-resistance effect layer and then this resist is exposed over the pair of bias-applying layers and the magneto-resistance effect layer, a reflected light is reflected toward the direction along the incident direction of the incident light in portions other than the step portion, so that the resist formed in the portions other than the step portion is exposed sufficiently. However, in the step portion, the reflected light is reflected toward directions completely different from the incident direction of the incident light, so that the resist formed in the step portion is exposed insufficiently. Accordingly, development of the exposed resist can give a resist layer, wherein the width of the portion located above the bias-applying layer in the depth direction relative to the medium facing surface is larger than that of the portion located above the magneto-resistance effect layer in the depth direction relative to the medium facing surface, as seen from the above. As a result, by etching a part of the magneto-resistance effect layer and a part of the pair of bias-applying layers with such resist layer being as a mask, a thin film magnetic head, wherein the width of the bias-applying layer in the depth direction relative to the medium facing surface is larger than that of the magneto-resistance effect element in the depth direction relative to the medium facing surface, can be produced, and it is therefore possible to achieve an improvement in the asymmetry characteristic without increasing the number of process steps.

In particular, the method of producing a thin film magnetic head concerning the present invention includes a step of forming a metal layer group by laminating at least one metal layer, which covers an upper surface of a portion located between the pair of bias-applying layers in the magneto-resistance effect layer and an upper surface of the pair of bias-applying layers, wherein a metal layer located on the uppermost part of the metal layer group is comprised of Ti and the magnitude D of the step is set to not less than 36.0 nm, or a metal layer located on the uppermost part of the metal layer group is comprised of Ta and the magnitude D of the step is set to not less than 31.2 nm, or a metal layer located on the uppermost part of the metal layer group is comprised of W and the magnitude D of the step is set to not less than 18.0 nm, or a metal layer located on the uppermost part of the metal layer group is comprised of NiCr and the magnitude D of the step is set to not less than 16.7 nm, or a metal layer located on the uppermost part of the metal layer group is comprised of Mo and the magnitude D of the step is set to not less than 8.1 nm, or a metal layer located on the uppermost part of the metal layer group is comprised of Ru and the magnitude D of the step is set to not less than 2.3 nm, or a metal layer located on the uppermost part of the metal layer group is comprised of Al and the magnitude D of the step is set to not less than 0.2 nm. If the difference between the width of the bias-applying layer in the depth direction relative to the medium facing surface and that of the magneto-resistance effect element in the depth direction relative to the medium facing surface is not less than 20 nm, it is possible to sufficiently reduce the variation in the asymmetry characteristic, however if the type of metal constituting a portion located on the uppermost part of the metal layer and the magnitude D of the step do not satisfy the above-described relationship, the difference between the width of the bias-applying layer in the depth direction relative to the medium facing surface and that of the magneto-resistance effect element in the depth direction relative to the medium facing surface tends to be smaller than 20 nm.

On the other hand, the thin film magnetic head concerning the present invention is a thin film magnetic head having a medium facing surface, comprising: an upper magnetic shield layer and a lower magnetic shield layer opposed to each other; a magneto-resistance effect element located between the upper magnetic shield layer and the lower magnetic shield layer; a pair of bias-applying layers which is located between the upper magnetic shield layer and the lower magnetic shield layer and applies a bias magnetic field to the magneto-resistance effect element; and a metal layer group which is located in a region corresponding to the magneto-resistance effect element and the pair of bias-applying layers as seen from a laminating direction, and is formed by laminating at least one metal layer above the magneto-resistance effect element and the pair of bias-applying layers: wherein an upper surface of the pair of bias-applying layers is located closer to the upper magnetic shield layer side than an upper surface of the magneto-resistance effect element; wherein the width of the pair of bias-applying layers in the depth direction relative to the medium facing surface is larger than that of the magneto-resistance effect element in the depth direction relative to the medium facing surface; and wherein the metal layer group is set such that reflectivity $R_3$ for an incident light having a wavelength of 248 nm, the reflectivity being obtained by dividing a total value of a reflected light flux from each metal layer constituting the metal layer group at an interface between the metal layer group and a resist layer, assuming that the resist layer is adjacent onto the metal layer group, by a value of an incident light flux at the interface between the metal layer group and the assumed resist layer, satisfies the condition represented by the following formula (8), and also the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set so as to satisfy the condition represented by the following formula (9).

$$R_3 \geq 0.2 \qquad (8)$$

$$D \geq 210\exp(-7.6R_3) \text{ [nm]} \tag{9}$$

In the thin film magnetic head concerning the present invention, the upper surface of the pair of bias-applying layers is located closer to the upper magnetic shield layer side than the upper surface of the magneto-resistance effect element. This provides a step portion between the pair of bias-applying layers and the magneto-resistance effect element. When, in order to determine the width of the bias-applying layer and the width of the magneto-resistance effect element in the depth direction relative to the medium facing surface, a resist is applied above the pair of bias-applying layers and the magneto-resistance effect layer and then this resist is exposed over the pair of bias-applying layers and the magneto-resistance effect layer, the reflected light is reflected toward the direction along the incident direction of the incident light in portions other than the step portion, so that the resist formed in the portions other than the step portion is exposed sufficiently. However, because in the step portion the reflected light is reflected toward directions completely different from the incident direction of the incident light, the resist formed in the step portion is exposed insufficiently. Accordingly, development of the exposed resist can give a resist layer, wherein the width of the portion located above the bias-applying layer in the depth direction relative to the medium facing surface is larger than that of the portion located above the magneto-resistance effect element in the depth direction relative to the medium facing surface, as seen from the above. As a result, by etching a part of the magneto-resistance effect layer and a part of the pair of bias-applying layers with such resist layer being as a mask, the width of the bias-applying layer in the depth direction relative to the medium facing surface can be made larger than that of the magneto-resistance effect element in the depth direction relative to the medium facing surface as the thin-film magnetic head concerning the present invention, and it is therefore possible to achieve an improvement in the asymmetry characteristic without increasing the number of process steps.

In particular, the thin-film magnetic head concerning the present invention includes a metal layer group which is located in a region corresponding to the magneto-resistance effect element and the pair of bias-applying layers as seen from a laminating direction and is formed by laminating at least one metal layer above the magneto-resistance effect element and the pair of bias-applying layers, wherein the reflectivity $R_1$ is set so as to satisfy the condition represented by the above formula (8) and also the magnitude D of the step is set so as to satisfy the condition represented by the following formula (9). If the difference between the width of the bias-applying layer in the depth direction relative to the medium facing surface and that of the magneto-resistance effect element in the depth direction relative to the medium facing surface is not less than 20 nm, it is possible to sufficiently reduce the variation in the asymmetry characteristic, however if the reflectivity $R_1$ and the magnitude D of the step do not satisfy the above formulas (8) and (9), the difference between the width of the bias-applying layer in the depth direction relative to the medium facing surface and that of the magneto-resistance effect element in the depth direction relative to the medium facing surface tends to be smaller than 20 nm.

Moreover, it is preferable that the magnitude D of the step be set so as to further satisfy the condition that the magnitude D is not more than ½ of a direct distance between the upper magnetic shield layer and the lower magnetic shield layer. If the magnitude D of the step is larger than ½ of the direct distance between the upper magnetic shield layer and the lower magnetic shield layer, the step in the step portion provided between the pair of bias-applying layers and the magneto-resistance effect element becomes extremely large and thus the shape of the upper magnetic shield layer formed on the pair of bias-applying layers and the magneto-resistance effect element results in a distortion, so that the function as shield tends not to be exerted sufficiently in the upper magnetic shield layer.

Moreover, it is preferable that the magnitude D of the step be set so as to further satisfy the condition represented by the following formula (10).

$$D \leq 45 \text{ [nm]} \tag{10}$$

If the magnitude D of the step does not satisfy the condition represented by the above formula (10), the step in the step portion provided between the pair of bias-applying layers and the magneto-resistance effect element becomes extremely large and thus the shape of the upper magnetic shield layer formed on the pair of bias-applying layers and the magneto-resistance effect element results in a distortion, so that the function as shield tends not to be exerted sufficiently in the upper magnetic shield layer.

Moreover, it is preferable that the magnitude D of the step be set so as to further satisfy the condition represented by the following formula (11).

$$D \leq 20 \text{ [nm]} \tag{11}$$

If the magnitude D of the step satisfies the condition represented by the above formula (11), it is possible to achieve an improvement in the asymmetry characteristic while exerting the function as shield sufficiently in the upper magnetic shield layer.

Moreover, it is preferable that the reflectivity $R_3$ be set so as to further satisfy the condition represented by the following formula (12).

$$R_3 \geq 0.3 \tag{12}$$

Moreover, it is preferable that the metal layer group be set such that the reflectivity $R_4$ for the incident light having a wavelength of 248 nm at the interface between a metal layer located on the uppermost part of the metal layer group and the assumed resist layer satisfies the condition represented by the following formula (13) and also that the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set so as to satisfy the condition represented by the following formula (14).

$$R_4 \geq 0.2 \tag{13}$$

$$D \geq 210\exp(-7.6R_4) \text{ [nm]} \tag{14}$$

If the difference between the width of the bias-applying layer in the depth direction relative to the medium facing surface and that of the magneto-resistance effect element in the depth direction relative to the medium facing surface is not less than 20 nm, it is possible to sufficiently reduce the variation in the asymmetry characteristic, and if the reflectivity $R_2$ and the magnitude D of the step satisfy the above formulas (13) and (14), the difference between the width of the bias-applying layer in the depth direction relative to the medium facing surface and that of the magneto-resistance effect element in the depth direction relative to the medium facing surface is easily made larger than 20 nm.

Moreover, it is preferable that the assumed resist layer has the refractive index of 1.6 to 1.8 for the incident light with a wavelength of 248 nm and the absorption coefficient of 0 to 0.001.

Moreover, the thin film magnetic head concerning the present invention is a thin film magnetic head having a medium facing surface, comprising: an upper magnetic shield layer and a lower magnetic shield layer opposed to each other; a magneto-resistance effect element located between the upper magnetic shield layer and the lower magnetic shield layer; a pair of bias-applying layers which is located between the upper magnetic shield layer and the lower magnetic shield layer and applies a bias magnetic field to the magneto-resistance effect element; and a metal layer group which is located in a region corresponding to the magneto-resistance effect element and the pair of bias-applying layers as seen from a laminating direction, and is formed by laminating at least one metal layer above the magneto-resistance effect element and the pair of bias-applying layers; wherein an upper surface of the pair of bias-applying layers is located closer to the upper magnetic shield layer side than an upper surface of the magneto-resistance effect element; wherein a width of the pair of bias-applying layers in the depth direction relative to the medium facing surface is larger than that of the magneto-resistance effect element in the depth direction relative to the medium facing surface; wherein a metal layer located on the uppermost part of the metal layer group is comprised of Ti and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 36.0 nm; or wherein a metal layer located on the uppermost part of the metal layer group is comprised of Ta and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 31.2 nm; or wherein a metal layer located on the uppermost part of the metal layer group is comprised of W and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 18.0 nm; or wherein a metal layer located on the uppermost part of the metal layer group is comprised of NiCr and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 16.7 nm; or wherein a metal layer located on the uppermost part of the metal layer group is comprised of Mo and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 8.1 nm; or wherein a metal layer located on the uppermost part of the metal layer group is comprised of Ru and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 2.3 nm; or wherein a metal layer located on the uppermost part of the metal layer group is comprised of Al and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 0.2 nm.

In the thin film magnetic head concerning the present invention, the upper surface of the pair of bias-applying layers is located closer to the upper magnetic shield layer side than the upper surface of the magneto-resistance effect element. This provides a step portion between the pair of bias-applying layers and the magneto-resistance effect element. When, in order to determine the width of the bias-applying layer and the width of the magneto-resistance effect element in the depth direction relative to the medium facing surface, a resist is applied above the pair of bias-applying layers and the magneto-resistance effect layer and then this resist is exposed over the pair of bias-applying layers and the magneto-resistance effect layer, the reflected light is reflected toward the direction along the incident direction of the incident light in portions other than the step portion, so that the resist formed in the portions other than the step portion is exposed sufficiently. However, because in the step portion the reflected light is reflected toward directions completely different from the incident direction of the incident light, the resist formed in the step portion is exposed insufficiently. Accordingly, development of the exposed resist can give a resist layer, wherein the width of the portion located above the bias-applying layer in the depth direction relative to the medium facing surface is larger than that of the portion located above the magneto-resistance effect element in the depth direction relative to the medium facing surface, as seen from the above. As a result, by etching a part of the magneto-resistance effect layer and a part of the pair of bias-applying layers with such resist layer being as a mask, the width of the bias-applying layer in the depth direction relative to the medium facing surface can be made larger than that of the magneto-resistance effect element in the depth direction relative to the medium facing surface as the thin-film magnetic head concerning the present invention, and it is therefore possible to achieve an improvement in the asymmetry characteristic without increasing the number of process steps.

In particular, the thin-film magnetic head concerning the present invention includes a metal layer group which is located in a region corresponding to the magneto-resistance effect element and the pair of bias-applying layers as seen from a laminating direction and is formed by laminating at least one metal layer above the magneto-resistance effect element and the pair of bias-applying layers, wherein a metal layer located on the uppermost part of the metal layer group is comprised of Ti and the magnitude D of the step is set to not less than 36.0 nm, or a metal layer located on the uppermost part of the metal layer group is comprised of Ta and the magnitude D of the step is set to not less than 31.2 nm, or a metal layer located on the uppermost part of the metal layer group is comprised of W and the magnitude D of the step is set to not less than 18.0 nm, or a metal layer located on the uppermost part of the metal layer group is comprised of NiCr and the magnitude D of the step is set to not less than 16.7 nm, or a metal layer located on the uppermost part of the metal layer group is comprised of Mo and the magnitude D of the step is set to not less than 8.1 nm, or a metal layer located on the uppermost part of the metal layer group is comprised of Ru and the magnitude D of the step is set to not less than 2.3 nm, or a metal layer located on the uppermost part of the metal layer group is comprised of Al and the magnitude D of the step is set to not less than 0.2 nm. If the difference between the width of the bias-applying layer in the depth direction relative to the medium facing surface and that of the magneto-resistance effect element in the depth direction relative to the medium facing surface is not less than 20 nm, it is possible to sufficiently reduce the variation in the asymmetry characteristic, however if the type of metal constituting a portion located on the uppermost part of the metal layer and the magnitude D of the step do not satisfy the above-described relationship, the difference between the width of the bias-applying layer in the depth direction relative to the medium facing surface and that of the magneto-resistance effect element in the depth direction relative to the medium facing surface tends to be smaller than 20 nm.

As described above, according to the present invention, it is possible to provide a thin film magnetic head and method of producing the same capable of achieving an improvement in the asymmetry characteristic without increasing the number of process steps.

The present invention will be more fully understood from the detailed description given here in below and the accompanying drawings which are given by way of illustration only, and thus are not to be considered as limiting the present invention.

BRIEF DESCRIPTION OF THE DRAWINGS

FIG. 5 is a partially enlarged view of the TMR element as seen from the laminating direction.

(a) of FIG. 7 is a plan view showing a part of the production process of a reading head part concerning the present embodiment, and (b) FIG. 7 is a cross sectional view along the B-B line in (a) of FIG. 7.

(a) of FIG. 8 is a plan view showing a subsequent step of FIG. 7, and (b) of FIG. 8 is a cross sectional view along the B-B line in (a) of FIG. 8.

(a) of FIG. 9 is a plan view showing a subsequent step of FIG. 8, and (b) of FIG. 9 is a cross sectional view along the B-B line in (a) of FIG. 9.

(a) of FIG. 10 is a plan view showing a subsequent step of FIG. 9, and (b) of FIG. 10 is a cross sectional view along the B-B line in (a) of FIG. 10.

(a) of FIG. 11 is a plan view showing a subsequent step of FIG. 10, and (b) of FIG. 11 is a cross sectional view along the B-B line in (a) of FIG. 11.

FIG. 12 is a table showing a result of the amount of constriction versus the magnitude of a step measured for each type of material constituting a metal layer.

Figure 13:
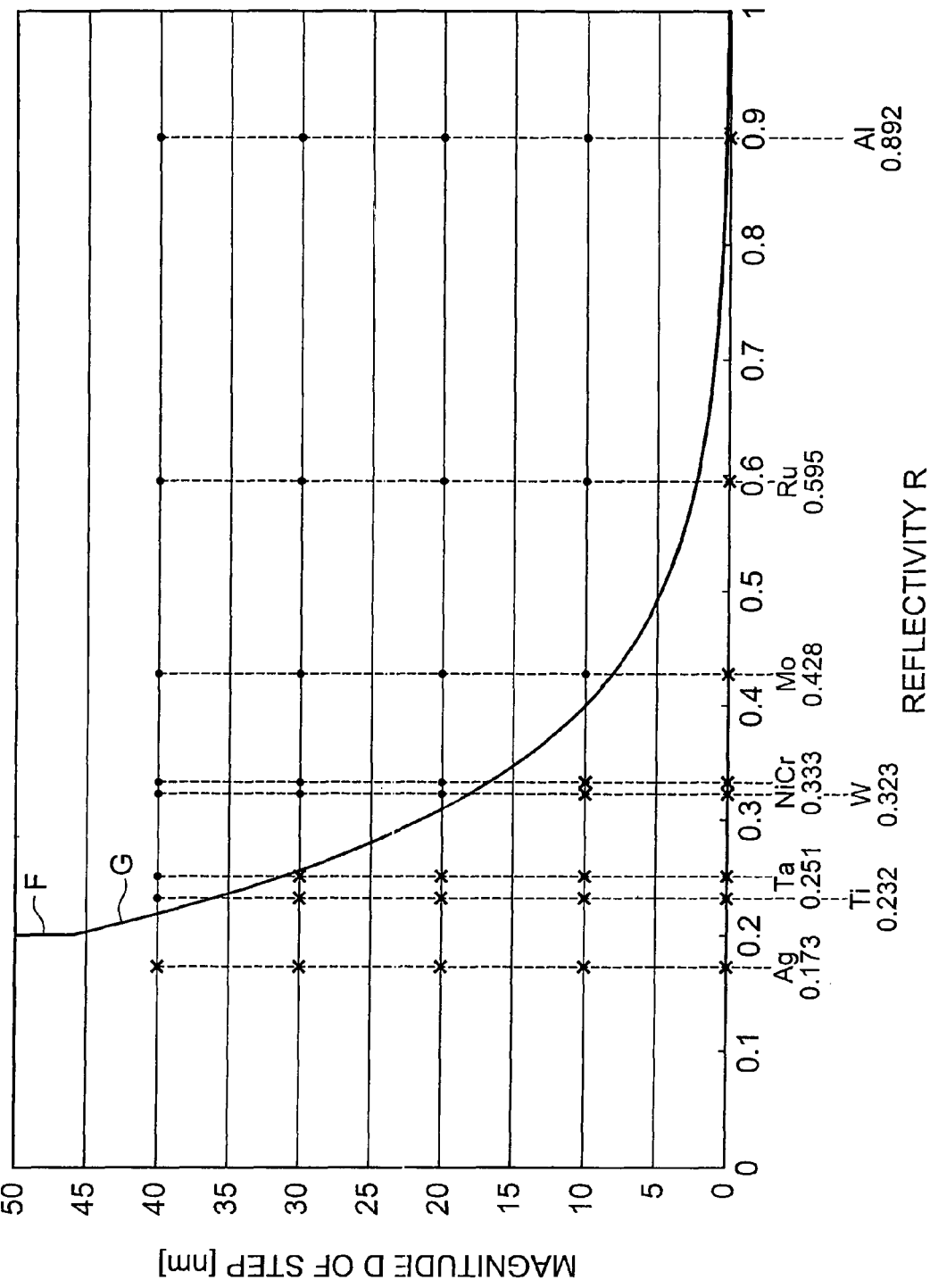

FIG. 13 is a graph showing a relationship between reflectivity and the magnitude of the step.

Figure 14:
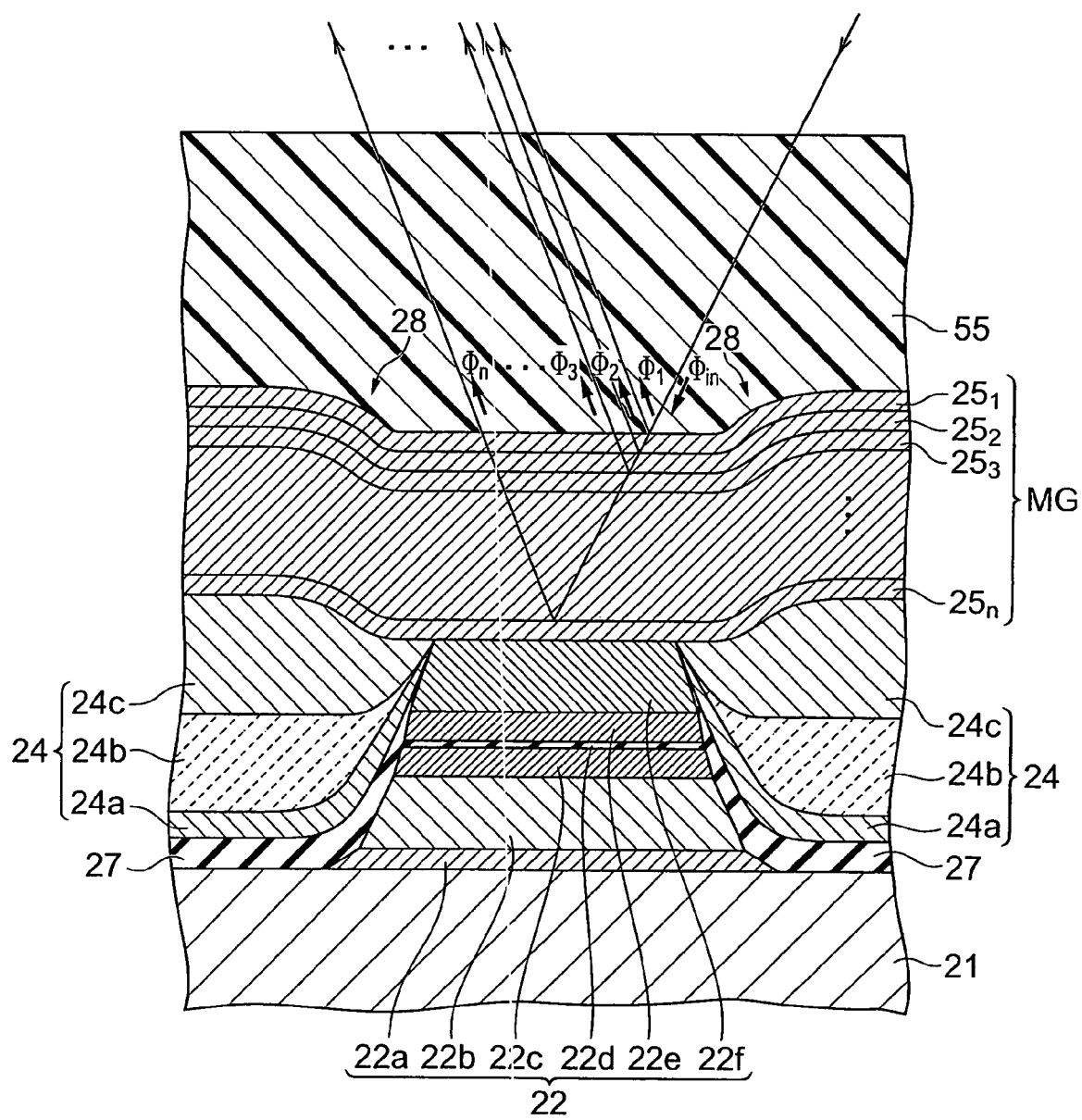

FIG. 14 is a view illustrating a relationship between an incident light and a reflected light when a plurality of metal layers exists.

DESCRIPTION OF THE PREFERRED EMBODIMENTS

Hereinafter, a preferred embodiment of the present invention will be described with reference to the accompanying drawings.

(Structure of a Thin Film Magnetic Head)

First, the structure of a thin film magnetic head 1 concerning the present embodiment will be described with reference to FIG. 1 to FIG. 5.

Figure 1:
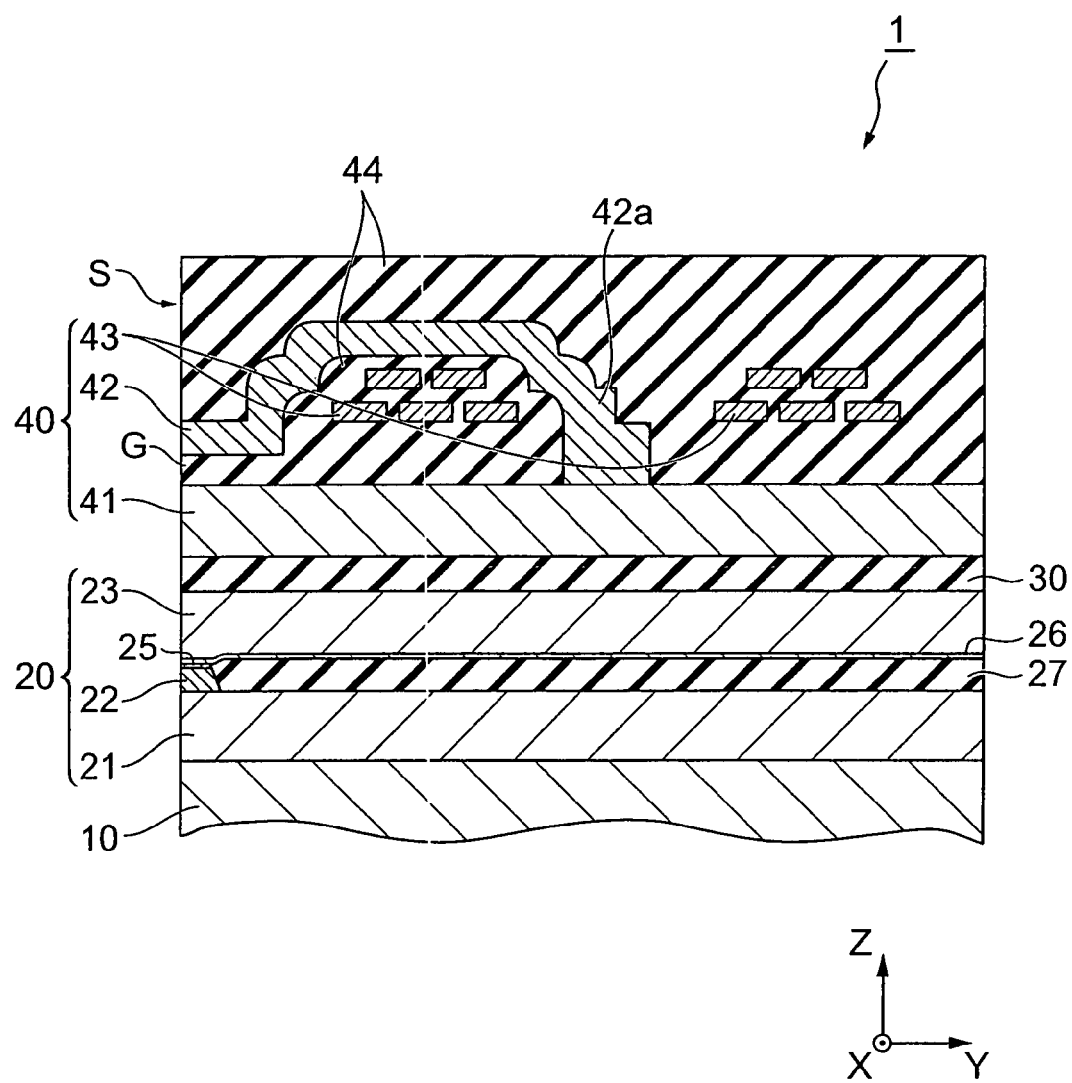
FIG. 1 is a schematic cross sectional view of a thin film magnetic head concerning the present embodiment, the schematic cross sectional view being perpendicular to a medium facing surface and as seen from a track width direction.

As shown in FIG. 1, the thin film magnetic head 1 is provided on top of a base 10, forming a part of a non-illustrated magnetic head slider. The thin film magnetic head 1 is a composite thin film magnetic head, wherein a reading head part 20 having a TMR (Tunneling Magneto Resistance) element 22 described below, an insulating layer 30, and a recording head part 40 as an induction type electromagnetic transducer for writing are laminated sequentially on the base 10. In the thin film magnetic head 1, the end face on the left side in FIG. 1 is a medium facing surface (Air Bearing Surface) S opposed to a recording surface of a non-illustrated hard disk. Although not illustrated in detail, the base 10 has such a structure that an underlayer comprised of electrically insulating material, such as alumina ($Al_2O_3$), is formed with a thickness of about 0.3 μm to 5.0 μm on a substrate comprised of AlTiC ($Al_2O_3$.TiC).

In the reading head part 20, a lower magnetic shield layer 21 serving also as a lower electrode, a TMR element 22, and an upper magnetic shield layer 23 serving also as an upper electrode are laminated on the base 10 in this order. Moreover, between the lower magnetic shield layer 21 and the upper magnetic shield layer 23, there are formed a bias-applying layer 24 (see FIG. 2), a metal layer 25, a seed layer 26, and an insulating layer 27.

The lower magnetic shield layer 21 and the upper magnetic shield layer 23 are comprised of electrically-conductive soft magnetic material such as NiFe (permalloy) and prevent the TMR element 22 from sensing an unnecessary external magnetic field.

The TMR element 22 is disposed at the medium facing surface S side so as to be exposed to the medium facing surface S. As illustrated in detail in FIG. 2, the TMR element 22 has such a structure that a lower metal layer 22a, a pin layer 22b, a pinned layer 22c, a tunnel barrier layer 22d, a free layer 22e, and an upper metal layer 22f are laminated in this order. A sense current flows in the TMR element 22 in the direction of layering of the layers 22a to 22f comprised by the TMR element 22 (the film thickness direction of the free layer 22e; the Z-axis direction in FIG. 1 to FIG. 5). The thickness (the width in the X axis direction in FIG. 1 to FIG. 5) of the TMR element 22 may be set to between about 15 nm to 30 nm, for example.

Figure 2:
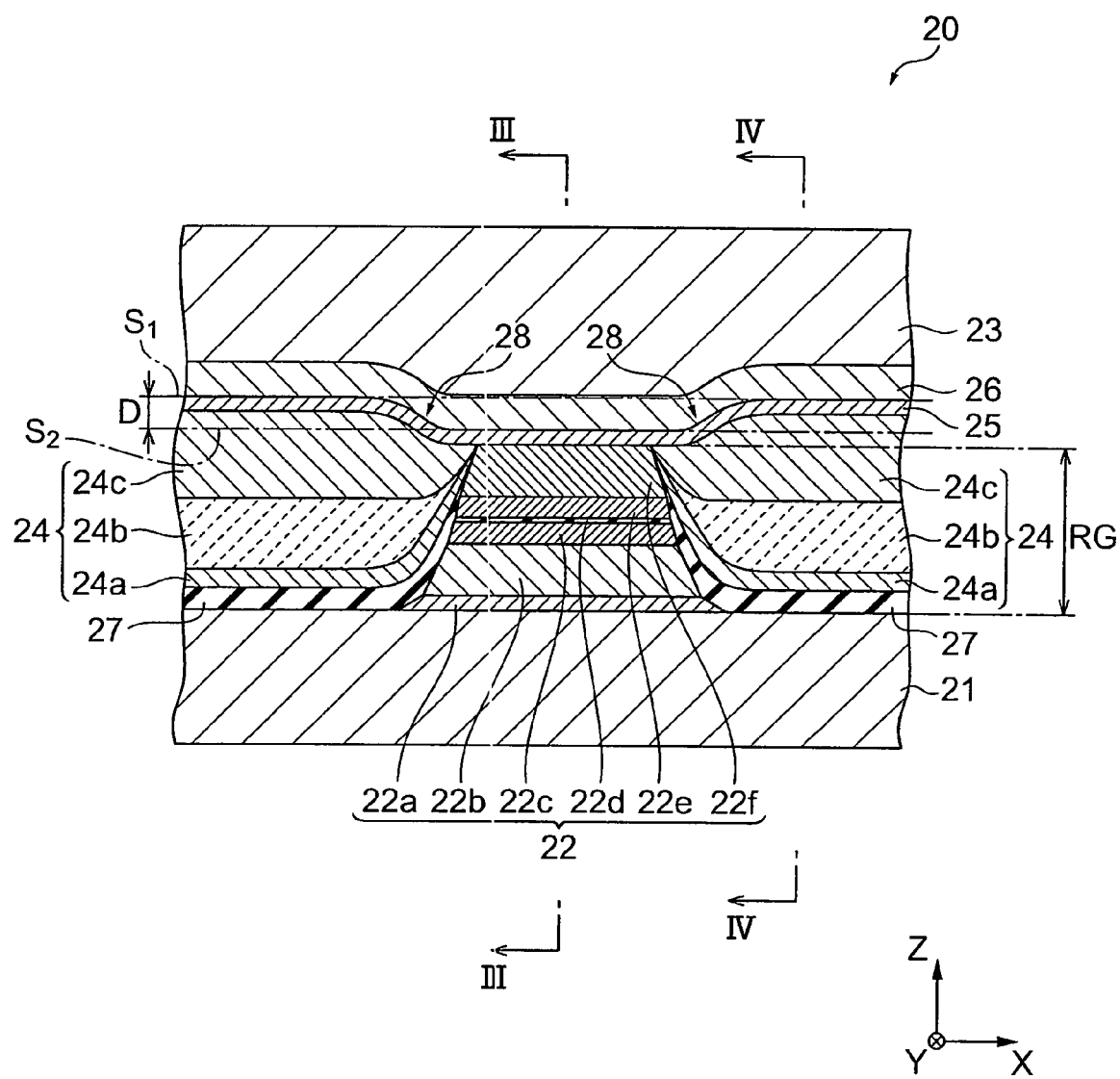
FIG. 2 is a partially enlarged view of a TMR element as seen from the medium facing surface.

As illustrated in FIG. 2, the lower metal layer 22a is comprised of nonmagnetic conductive metal material such as Ta, and adjusts the read gap corresponding to the recording density of a recording medium to a desired value. The pin layer 22b is made of antiferromagnetic material, such as PtMn, IrMn, and NiO, and is formed on the lower metal layer 22a. At this time, the lower metal layer 22a functions as the underlayer. The pinned layer 22c is comprised of soft magnetic material, such as Fe, Co, Ni, NiFe, CoFe, CoZrNb, and FeCoNi, and is formed on the pin layer 22b. The direction of magnetization of the pinned layer 22c is fixed in a uniform direction (the depth direction relative to the medium facing surface S, or the Y axis direction in FIG. 1 to FIG. 5) by the exchange coupling produced at the interface between the pin layer 22b and the pinned layer 22c.

The tunnel barrier layer 22d allows electrons to pass therethrough while keeping their spin due to a tunnel effect, and can be formed of insulating material, such as $Al_2O_3$, NiO, MgO, $Ta_2O_5$, and $TiO_2$, for example. The free layer 22e is comprised of soft magnetic material, such as Fe, Co, Ni, NiFe, CoFe, CoZrNb, and FeCoNi, and is formed on the tunnel barrier layer 22d. The direction of magnetization of the free layer 22e varies corresponding to a leakage magnetic field from the recording medium, which is an external magnetic field. The upper metal layer 22f is comprised of non-magnetic conductive metal material such as Ta, and is formed on the free layer 22e. This upper metal layer 22f adjusts the read gap corresponding to the recording density of the recording medium to a desired value, as the lower metal layer 22a does.

In addition, a GMR (Giant Magneto Resistive) element using a giant magneto-resistance effect of a high magneto-resistance change rate, an AMR (Anisotropy Magneto Resistive) element using an anisotropy magneto-resistance effect, a CPP (Current Perpendicular to Plane)-GMR element, or the like may be used in place of the TMR element 22.

As illustrated in detail in FIG. 2, the bias-applying layers 24 are disposed via the insulating layer 27 at both sides of the TMR element 22 in the track width direction. In other words, the bias-applying layers 24 are disposed spaced apart in the track width direction (X axis direction in FIG. 1 to FIG. 5) so as to sandwich the TMR element 22 therebetween. The thickness (the width in the X axis direction in FIG. 1 to FIG. 5) of the bias-applying layer 24 may be set to between about 15 to 60 nm, for example.

The bias-applying layer 24 has such a structure that a metal layer 24a, a hard magnetic layer 24b, and a metal layer 24c are laminated in this order. The metal layers 24a and 24c can be formed of non-magnetic metal material, such as Cr, for example, and adjusts the thickness (the width in the X axis direction in FIG. 1 to FIG. 5) of the bias-applying layer 24. The hard magnetic layer 24b is comprised of hard magnetic material such as CoPt, and applies a bias magnetic field to the free layer 24e.

Figure 3:
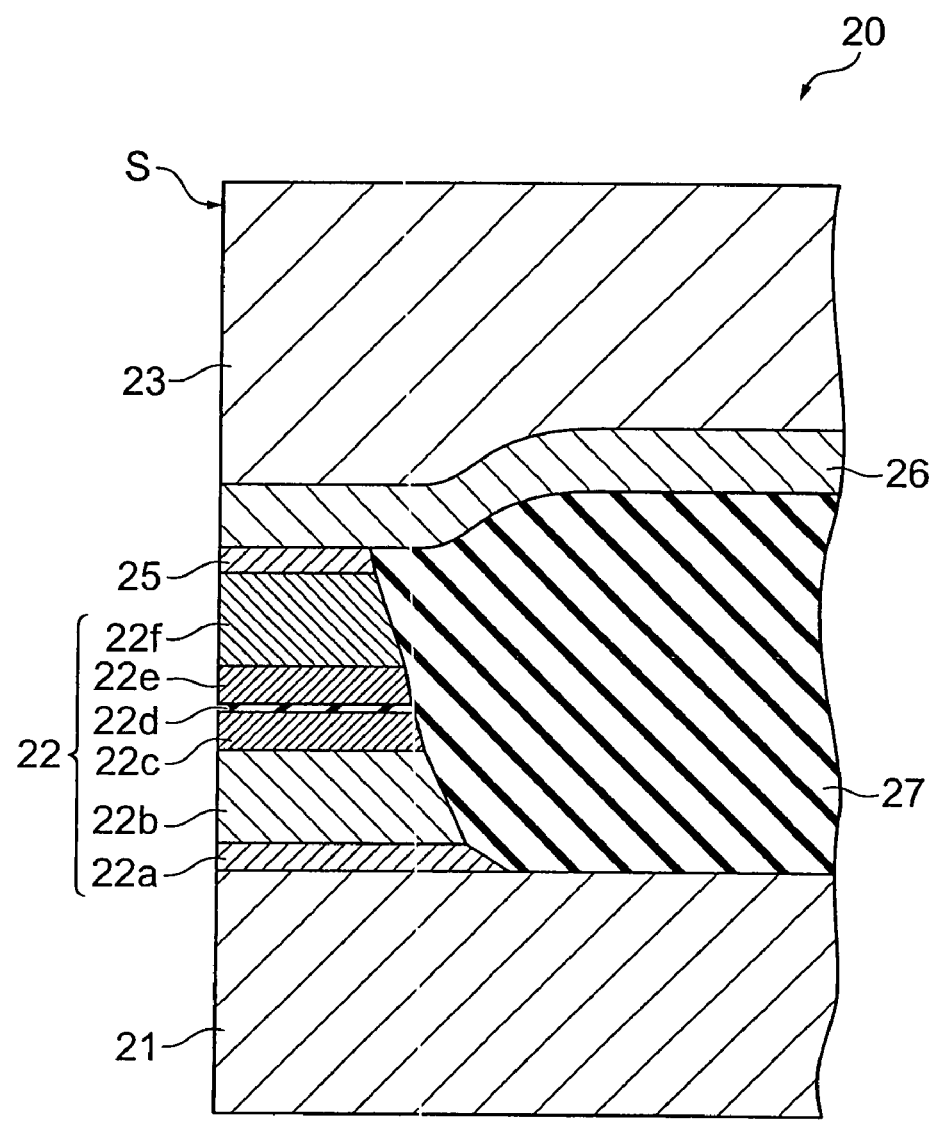
FIG. 3 is a cross sectional view along the III-III line of FIG. 2.
Figure 4:
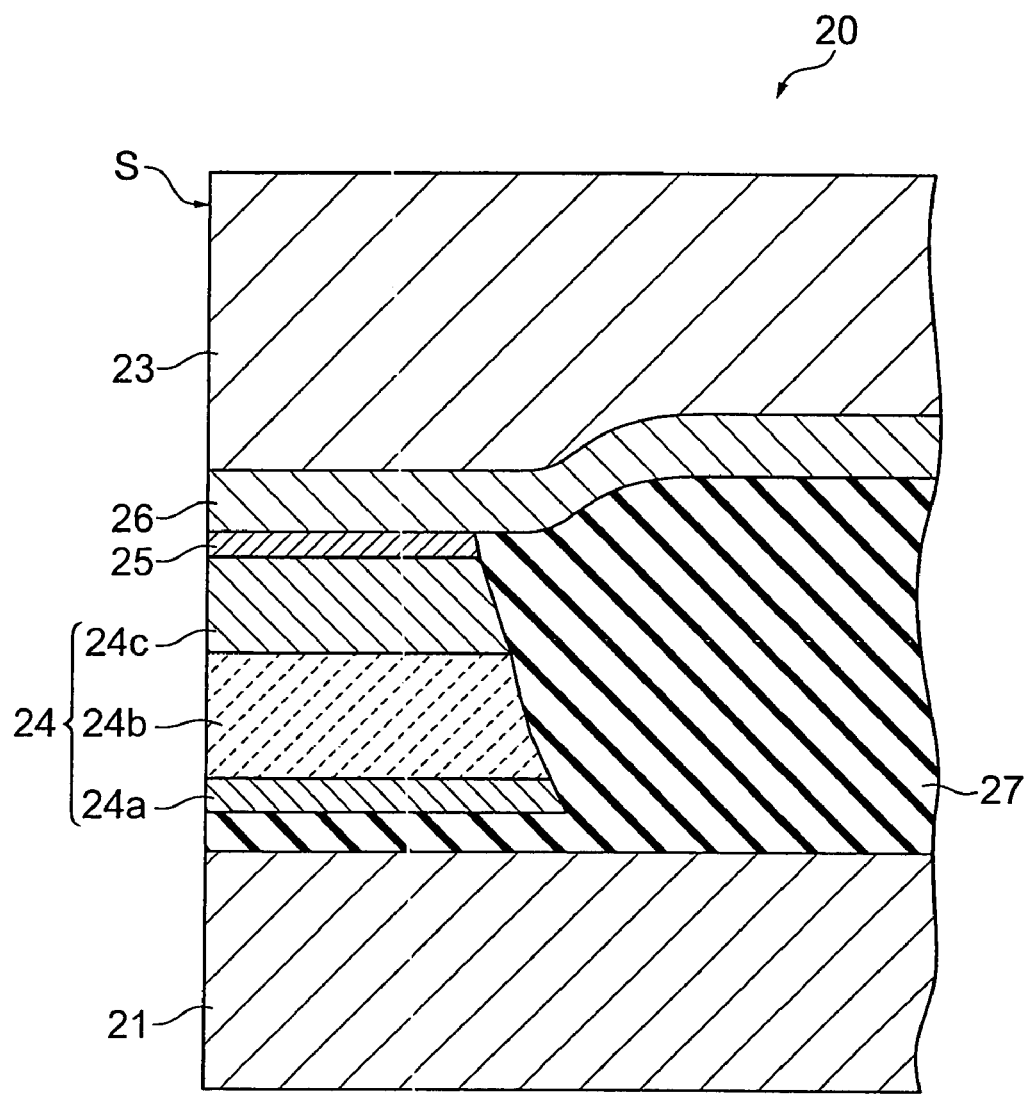
FIG. 4 is a cross sectional view along the IV-IV line of FIG. 2.
Figure 6:
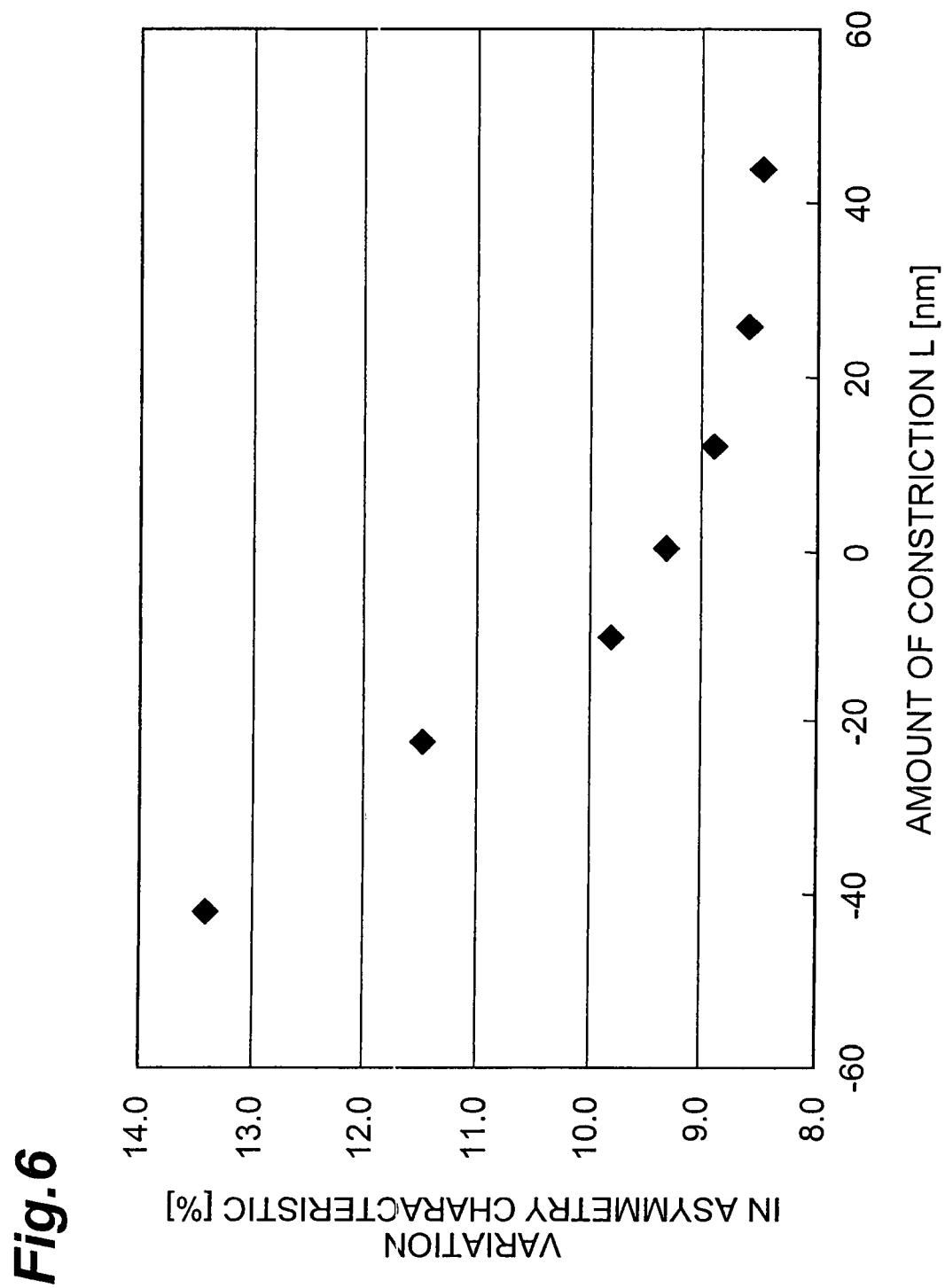
FIG. 6 is a view showing correspondence between the amount of constriction and the variation in asymmetry characteristic.

As indicated in comparison between FIG. 3 and FIG. 4 and as shown in FIG. 5, the width of the bias-applying layer 24 in the depth direction (Y axis direction in FIG. 1 to FIG. 5) relative to the medium facing surface S is larger than that of the TMR element 22 in the depth direction (Y axis direction in FIG. 1 to FIG. 5) relative to the medium facing surface S. In this embodiment, a difference (amount of constriction) L (see FIG. 5) between the width of the bias-applying layer 24 in the depth direction (Y axis direction in FIG. 1 to FIG. 5) relative to the medium facing surface S and the width of the TMR element 22 in the depth direction (Y axis direction in FIG. 1 to FIG. 5) relative to the medium facing surface S is set to not less than 20 nm. For this reason, in the thin film magnetic head 1 concerning the present embodiment, as shown in FIG. 6, it is possible to sufficiently reduce the variation in the asymmetry characteristic. In addition, the correspondence between the amount of constriction and the variation in the asymmetry characteristic as shown in FIG. 6 was obtained by preparing 200 pieces of thin film magnetic heads 1 whose amount of constriction L is set to −42 nm, −22.3 nm, −10.1 nm, 0.4 nm, 12 nm, 25.7 nm, and 44 nm, respectively, and by measuring the asymmetry [%] about each element and then calculating one sigma (a standard deviation value) for each group of elements having the same amount of constriction L.

As shown in FIG. 2 to FIG. 4, the metal layer 25 is located in a region that corresponds to the bias-applying layer 24 and the TMR element 22 as seen from the laminating direction (Z axis direction in FIG. 1 to FIG. 5), and is laminated on the bias-applying layer 24 as well as on the TMR element 22. The reflectivity R for the incident light having a wavelength of 248 nm at the interface between the metal layer 25 and a resist layer 55 is set so as to satisfy the following formula (15). In addition, this resist layer 55 (see FIG. 10) is temporarily in contact with the metal layer 25 during the production process of the thin film magnetic head and will not remain in a finished product (the detail will be described later).

$$R \geq 0.2 \quad (15)$$

Here, the reflectivity $R_{ij}$ at an interface between two media i, j is represented by the following formula (16).

$$R_{ij} = \frac{(n_i - n_j)^2 + (k_i - k_j)^2}{(n_i + n_j)^2 + (k_i + k_j)^2} \quad (16)$$

For example, an ordinary resist layer such as a polyhydroxystyrene-based chemically amplified resist has the refractive index $n_j$ of about 1.6 to 1.8 for the incident light with a wavelength of 248 nm and the absorption coefficient $k_j$ of about 0 to 0.001. In calculation of the reflectivity $R_{ij}$, the absorption coefficient $k_j$ of the resist layer can be neglected because it is small as compared with the absorption coefficient $k_i$ of a metal. Accordingly, let the refractive index of the resist layer be $n_j$, then the metal layer 25 is formed of a metallic material whose refractive index $n_i$ and absorption coefficient $k_i$ for the incident light having a wavelength of 248 nm satisfy the following formula (17).

$$\frac{(n_i - n_j)^2 + k_i^2}{(n_i + n_j) + k_i^2} \geq 0.2 \quad (17)$$

Specifically, the metal layer 25 can be formed of Ti (reflectivity R=0.232), Ta (reflectivity R=0.251), W (reflectivity R=0.323), NiCr (reflectivity R=0.333), Mo (reflectivity R=0.428), Ru (reflectivity R=0.595), Al (reflectivity R=0.892), or the like. In addition, it is more preferable that the reflectivity R satisfy the following formula (18). Moreover, it is more preferable that the metal layer 25 be formed of a metallic material whose refractive index $n_i$ and absorption coefficient $k_i$ for the incident light having a wavelength of 248 nm satisfy the following formula (19).

$$R \geq 0.3 \quad (18)$$

$$\frac{(n_i - n_j)^2 + k_i^2}{(n_i + n_j)^2 + k_i^2} \geq 0.3 \quad (19)$$

In other words, it is more preferable that the metal layer 25 be formed of W, NiCr, Mo, Ru, Al, or the like.

As shown in FIG. 2, a portion located above the bias-applying layer 24 in the metal layer 25 is located closer to the upper magnetic shield layer 23 side than a portion located above the TMR element 22 in the metal layer 25. In other words, a step portion 28 is provided between the portion located above the bias-applying layer 24 in the metal layer 25 and the portion located above the TMR element 22 in the metal layer 25 (between the bias-applying layer 24 and the TMR elements 22).

The magnitude D of the step, which is a direct distance between a virtual plane $S_1$ including the upper surface of the portion located above the bias-applying layer 24 in the metal layer 25 and a virtual plane $S_2$ including the upper surface of the portion located above the TMR element 22 in the metal layer 25, is set so as to satisfy the following formula (20).

$$D \geq 210\exp(-7.6R) \text{ [nm]} \tag{20}$$

Here, from the above formulas (17) and (20), the magnitude D of the step is set so as to satisfy also the following formula (21).

$$D \geq 210\exp\left(-7.6 \times \frac{(n_i - n_j)^2 + k_i^2}{(n_i + n_j)^2 + k_i^2}\right) \text{ [nm]} \tag{21}$$

In addition, from the above formula (20), if the metal layer 25 is comprised of Ti (reflectivity R=0.232), the magnitude D of the step is set not less than 36.0 nm. If the metal layer 25 is comprised of Ta (reflectivity R=0.251), the magnitude D of the step is set not less than 31.2 nm. If the metal layer 25 is comprised of W (reflectivity R=0.323), the magnitude D of the step is set not less than 18.0 nm. If the metal layer 25 is comprised of NiCr (reflectivity R=0.333), the magnitude D of the step is set not less than 16.7 nm. If the metal layer 25 is comprised of Mo (reflectivity R=0.428), the magnitude D of the step is set not less than 8.1 nm. If the metal layer 25 is comprised of Ru (reflectivity R=0.595), the magnitude D of the step is set not less than 2.3 nm. If the metal layer 25 is comprised of Al (reflectivity R=0.892), the magnitude D of the step is set not less than 0.2 nm.

Moreover, it is preferable that the magnitude D of the step be not more than ½ of a direct distance (read gap) RG between the lower magnetic shield layer 21 and the upper magnetic shield layer 23 in the laminating direction (Z axis direction in FIG. 1 to FIG. 5). If the magnitude D of the step is larger than ½ of the read gap, the step of the step portion 28 provided between the bias-applying layer 24 and the TMR element 22 becomes extremely large, and the shape of the upper magnetic shield layer 23 formed above the bias-applying layer 24 and the TMR element 22 results in a distortion, so that the function as shield tends not to be exerted sufficiently in the upper magnetic shield layer 23. Because in this embodiment the read gap RG is set to about 90 nm, it is preferable that the magnitude D of the step be set so as to satisfy the following formula (22), and it is more preferable that the magnitude D of the step be set so as to satisfy the following formula (23).

$$D \leq 45 \text{ [nm]} \tag{22}$$

$$D \leq 20 \text{ [nm]} \tag{23}$$

In particular, if the magnitude D of the step is set so as to satisfy the above formula (23), it is possible to achieve an improvement in the asymmetry characteristic white exerting the function as shield sufficiently in the upper magnetic shield layer 23.

As shown in FIG. 2 to FIG. 4, the seed layer 26 is formed on the metal layer 25 and the insulating layer 27 so as to cover the metal layer 25 and the insulating layer 27. The seed layer 26 is used in order to form the upper magnetic shield layer 23 by plating, and can be formed of Ti, Cr, and Ru, for example.

The insulating layer 27 is comprised of a metal oxide, such as $Al_2O_3$ or $SiO_2$, having electric insulation, and is provided in order to feed a sense current into the TMR element 22 for certain.

Back to FIG. 1, the insulating layer 30 is comprised of a metal oxide, such as $Al_2O_3$ or $SiO_2$, having electric insulation, and is disposed so as to be sandwiched by the reading head part 20 and the recording head part 40. The thickness of the insulating layer 30 in the laminating direction may be set to between about 0.1 µm and 2.0 µm, for example.

The recording head part 40 has a lower magnetic pole layer 41 and an upper magnetic pole layer 42 in this order from the substrate 10, and further has a thin film coil 43. Between the lower magnetic pole layer 41 and the thin film coil 43, between the upper magnetic pole layer 42 and the thin film coil 43, and above the upper magnetic pole layer 42, there is formed an insulating layer 44 comprised of a metal oxide, such as $Al_2O_3$ or $SiO_2$, having electric insulation, or comprised of resist which is an organic insulating material.

The lower magnetic pole layer 41 and the upper magnetic pole layer 42 are comprised of a high saturation magnetic flux density material, such as FeAlN, FeN, FeCo, CoFeN, or FeZrN. The end portions at the medium facing surface S side of the lower magnetic pole layer 41 and the upper magnetic pole layer 42 have a predetermined spacing from each other, and are exposed to the medium facing surface S, respectively, to form the recording gap G. On the other hand, an end portion 42a on the side far from the medium facing surface S in the upper magnetic pole layer 42 is connected to the lower magnetic pole layer 41, and thus the lower magnetic pole layer 41 and the upper magnetic pole layer 42 are magnetically coupled to each other. Accordingly, the lower magnetic pole layer 41 and the upper magnetic pole layer 42 form a magnetic (circuit across the recording gap G.

The thin film coil 43 is disposed so as to surround the end portion 42a in the upper magnetic pole layer 42, and generates a magnetic field in the recording gap G by electromagnetic induction to thereby store magnetic information in the recording surface of a hard disk.

(Method of Producing a Reading Head Part)

Next, a method of producing the reading head part 20 constituting the thin film magnetic head 1 will be described with reference to FIG. 1, and FIG. 7 to FIG. 10. In addition, each view illustrates only one element, but typically a plurality of thin film magnetic heads is produced from one substrate (wafer).

First, the description is made with reference to FIG. 7. On the base 10, in which an underlayer comprised of insulating material is formed on a substrate comprised of AlTiC ($Al_2O_3$.TiC), the lower magnetic shield layer 21 and a TMR layer 51 to serve as the TMR element 22 are sequentially laminated so as to be in a predetermined thickness. As the formation method, for example, it is possible to form the lower magnetic shield layer 21 by a wet plating method and then form the TMR layer 51 by sputtering, however, various other known techniques can be employed. In addition, in order to give a desired magnetic anisotropy to the lower magnetic shield layer 21 and the TMR layer 51, each layer is formed while applying a magnetic field, or a heat treatment is carried out after forming each layer, as needed.

Then, the next step is described with reference to FIG. 8. A resist layer 52 is formed so as to cover regions other than a region R where the bias-applying layer 24 is to be formed. Such resist layer 52 is formed by carrying out development treatment after applying a resist material, the resist material being polymerized by the irradiation of light or electron beam, onto the surface of the TMR layer 51 and then by irradiating light or electron beam. After forming the resist layer 52, the surface of the TMR layer 51 is exposed in regions other than the region R where the TMR element 22 is to be formed. Under this state, with the resist layer 52 being as a mask the exposed region is removed from the surface of the TMR layer 51 to the surface of the lower magnetic shield layer 21 by ion milling or the like to thereby form an opening 53.

Then, the next step is described with reference to FIG. 9. In a state where the resist layer 52 remains, an insulator 54 made of nonmagnetic insulating material is laminated in the opening 53 by sputtering or the like, and the metal layer 24a, the hard magnetic layer 24b, and the metal layer 24c are sequentially laminated in the opening 53 to from a pair of bias-applying layers 24. Then, the resist layer 52 is removed (lifted off) together with the deposition materials (insulator 54, metal layer 24a, hard magnetic layer 24b, and metal layer 24c) on the resist layer 52. Then, the metal layer 25 is laminated on the whole surface of this intermediate.

At this time, the bias-applying layer 24 is formed so that the upper surface of the bias-applying layer 24 comprised of the metal layer 24a, the hard magnetic layer 24b, and the metal layer 24c becomes higher than the upper surface of the TMR layer 51. As a result, the step portion 28 is provided between the portion located above the bias-applying layer 24 in the metal layer 25 and the portion located above the TMR element 22 in the metal layer 25 (between the bias-applying layer 24 and the TMR elements 22).

Then, the next step is described with reference to FIG. 10. The resist layer 55 is formed across an upper surface $A_1$ of a portion located above the pair of bias-applying layers 24 in the metal layer 25 and an upper surface $A_2$ of a portion located above the TMR layer 51 in the metal layer 25. Such resist layer 55 is formed by carrying out development treatment after applying a resist material, the resist material being polymerized by the irradiation of light (for example, KrF excimer laser) having a wavelength of 248 nm, onto the surface of the metal layer 25 and then by irradiating the light.

Then, the next step is described with reference to FIG. 11. With the resist layer 55 being as a mask, the exposed region in the surface is removed to the surface of the lower magnetic shield layer 21 by ion milling or the like. This determines the width of the bias-applying layer 24 and the width of the TMR element 22 in the depth direction (Y axis direction in FIG. 1 to FIG. 5) relative to the medium facing surface S. Then, in a state where the resist layer 52 remains, an insulator 56 comprised of nonmagnetic insulating material is laminated over the intermediate by sputtering or the like.

Subsequently, the resist layer 55 is removed (lifted off) together with the deposition material (insulator 56) on the resist layer 55. The upper magnetic shield layer 23 is further laminated. The upper magnetic shield layer 23 can be formed by a wet plating method, for example. In this way, the reading head part 20 is obtained. In addition, the insulators 54, 56 serve as the above-described insulating layer 27 (see FIG. 1 to FIG. 4).

Subsequently, although the details are omitted, as shown in FIG. 1, after depositing the insulating layer 30 on top of the reading head part 20, the recording head part 40 is formed on the insulating layer 30 by a known method, thus obtaining the thin film magnetic head 1. In addition, by applying a magnetic field in the track width direction (X axis direction in FIG. 1 to FIG. 5) from the outside after the thin film magnetic head 1 is formed, the hard magnetic layer 24b constituting the bias-applying layer 24 is magnetized in the track width direction (X axis direction in FIG. 1 to FIG. 5).

After forming a plurality of thin film magnetic heads 1 in a wafer as described above, a plurality of bars (not shown) is prepared from the wafer by dicing. A plurality of thin film magnetic heads 1 is arranged in parallel in each bar. At the stage where such bar has been prepared, lapping (polishing) for adjusting the height of the TMR element 22 is carried out. In addition, in this lapping process, lapping is carried out from a lapping plane, which is at the medium facing surface S side, toward the depth direction (Y axis direction in FIG. 1 to FIG. 5) relative to the medium facing surface S and when the height of the TMR element 22 becomes a predetermined one, the lapping is completed. After finishing the lapping process, each bar is cut in a unit of block, each of which includes the thin film magnetic head 1, and a slider rail is formed to obtain the so-called head slider. This completes a series of production steps of the thin film magnetic head 1.

In the embodiment described above, the step portion 28 is provided between a portion located above the bias-applying layer 24 in the metal layer 25 and a portion located above the TMR element 22 in the metal layer 25 (between the bias-applying layer 24 and the TMR elements 22). For this reason, in portions other than the step portion 28, the reflected light is reflected toward the direction along the incident direction of incident light, so that the resist material formed in portions other than the step portion 28 is exposed sufficiently. However, because in the step portion 28 the reflected light is reflected toward directions completely different from the incident direction of the incident light, the resist material formed in the step portion 28 is exposed insufficiently. Accordingly, development of the exposed resist material gives the resist layer 55, wherein the width of a portion located above the bias-applying layer 24 in the depth direction (Y axis direction in FIG. 1 to FIG. 5) relative to the medium facing surface S is larger than the width of a portion located above the TMR layer 51 in the depth direction (Y axis direction in FIG. 1 to FIG. 5) relative to the medium facing surface S, as seen from the above (see FIG. 10). In other words, due to the presence of the step portion 28, the resist layer 54 with such complicated shape is formed just by exposing a resist material by means of a mask having a rectangular opening. As a result, by etching a part of the TMR layer 51 and a part of the pair of bias-applying layers 24 with such resist layer 55 being as a mask, a thin film magnetic head, wherein the width of the bias-applying layer 24 in the depth direction (Y axis direction in FIG. 1 to FIG. 5) relative to the medium facing surface S is larger than the width of the TMR element 22 in the depth direction (Y axis direction in FIG. 1 to FIG. 5) relative to the medium facing surface S, can be produced, and it is therefore possible to achieve an improvement in the asymmetry characteristic without increasing the number of process steps.

In particular, in this embodiment, the reflectivity R is set so as to satisfy the condition represented by the above formula (15) and also the magnitude D of the step is set so as to satisfy the condition represented by the above formula (20). Moreover, the refractive index $n_i$ and absorption coefficient $k_i$ of the metal layer 25 for the incident light having a wavelength of 248 nm are set so as to satisfy the condition represented by the above formula (17), and also the magnitude D of the step is set so as to satisfy the condition represented by the above formula (21).

Here, there was conducted a test for verifying that if the above-described conditions are met, the amount of constriction L (see FIG. 5) in the depth direction described above becomes larger than 20 nm and the variation in the asymmetry characteristic can be reduced sufficiently. As the test, according to the above-described production method, the magnitude D of the step was set to 0 nm, 10 nm, 20 nm, 30 nm, and 40 nm, respectively, and the thin film magnetic heads 1 (40 types) whose metal layer 25 was formed of Ag, Ti, Ta, W, NiCr, Mo, Ru, and Al, respectively, were prepared, whereby the amount of constriction L was measured about each thin film magnetic head 1. FIG. 12 shows the measurement results of the amount of constriction L.

FIG. 13 shows, based on this measurement results of the amount of constriction L, with the horizontal axis as the reflectivity R and the vertical axis as the magnitude D of the step, the measurement results of the amount of constriction L not less than 20 nm by "•" and shows the measurement result of the amount of constriction L less than 20 nm by "x". As shown in FIG. 13, the measurement results of the amount of constriction L not less than 20 nm exist in the region on the right side relative to the straight line F and the curve G. These straight line F and curve G are represented by the following formulas (24) and (25), respectively.

$$R=0.2 \qquad (24)$$

$$D=210\exp(-7.6R) \text{ [nm]} \qquad (25)$$

Consequently, it was verified that if the conditions represented by the above formulas (15) and (20) are met, or if the conditions represented by the above formulas (17) and (21) are met, the amount of constriction L is not less than 20 nm and the variation in the asymmetry characteristic can be sufficiently reduced.

As described above, the preferred embodiment of the present invention has been described in detail, but the present invention is not limited to the above-described embodiment. For example, in the present embodiment the thin film magnetic head 1 has one metal layer 25, but as shown in FIG. 14, the thin film magnetic head 1 may have a metal layer group MG comprised of a plurality of metal layers $25_1$ to $25_n$ of the same type or different types. In this case, the reflectivity R for the incident light having a wavelength of 248 nm is defined as the value obtained by dividing a total value of reflected light fluxes $\Phi_1$ to $\Phi_n$ from each of the metal layers $25_1$ to $25_n$ constituting the metal layer group MG at the interface between the metal layer group MG and the resist layer 53 by a value of an incident light flux $\Phi_{in}$ at the interface between the metal layer group MG and the resist layer 53, and thus the reflectivity R can be represented as the following formula (26).

$$R = \frac{\sum_{m=1}^{n} \Phi_m}{\Phi_{in}} \quad (n \text{ is a natural number}) \qquad (26)$$

Moreover, at this time, the reflectivity R for the incident light having a wavelength of 248 nm at the interface between the metal layer (metal layer $25_1$ in FIG. 14) located on the uppermost part of the metal layer group MG and the resist 53 may be set so as to satisfy the condition represented by the above formula (15). Moreover, the refractive index $n_t$ and the absorption coefficient $k_t$ for the incident light having a wavelength of 248 nm of the metal layer (metal layer $25_1$ in FIG. 14) located on the uppermost part of the metal layer group MG may be set so as to satisfy the condition represented by the above formula (17).

It is apparent that various embodiments and modifications of the present invention can be embodied, based on the above description. Accordingly, it is possible to carry out the present invention in the other modes than the above best mode, within the following scope of claims and the scope of equivalents.

What is claimed is:

1. A method of producing a thin film magnetic head, comprising the steps of:

forming a lower magnetic shield layer on a base;

forming a magneto-resistance effect layer on the lower magnetic shield layer;

forming a pair of openings in a predetermined region of the magneto-resistance effect layer;

forming a pair of bias-applying layers in the pair of openings so that an upper surface thereof may be located above an upper surface of the magneto-resistance effect layer;

forming a metal layer group by laminating at least one metal layer, which covers an upper surface of the magneto-resistance effect layer located between the pair of bias-applying layers in the magneto-resistance effect layer and an upper surface of the pair of bias-applying layers;

forming a resist layer across the upper surface of a portion of the metal layer group located above the pair of bias-applying layers and the upper surface of the metal layer group located above the magneto-resistance effect layer;

etching a part of the magneto-resistance effect layer and a part of the pair of bias-applying layers with the resist layer being as a mask;

before removing the resist layer, forming an insulating layer over areas in which the resist layer is not formed; and forming an upper magnetic shield layer after removing the resist layer: wherein reflectivity $R_1$ for an incident light having a wavelength of 248 nm, the reflectivity being obtained by dividing a total value of a reflected light flux from each metal layer constituting the metal layer group at an interface between the metal layer group and the resist layer by a value of an incident light flux at the interface between the metal layer group and the resist layer, is set so as to satisfy a condition represented by the following formula (1); and wherein a magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set so as to satisfy the condition represented by the following formula (2):

$$R_1 \geq 0.2 \qquad (1)$$

$$D \geq 210\exp(-7.6R_1) \text{ [nm]} \qquad (2).$$

2. The method of producing a thin film magnetic head according to claim 1, wherein the magnitude D of the step is set so as to further satisfy the condition that the magnitude D is not more than ½ of the direct distance between the upper magnetic shield layer and the lower magnetic shield layer.

3. The method of producing a thin film magnetic head according to claim 1, wherein the magnitude D of the step is set so as to further satisfy the condition represented by the following formula (3):

$$D \leq 45 \text{ [nm]} \qquad (3).$$

4. The method of producing a thin film magnetic head according to claim 3, wherein the magnitude D of the step is set so as to further satisfy the condition represented by the following formula (4):

$$D \leq 20 \text{ [nm]} \tag{4}$$

5. The method of producing a thin film magnetic head according to claim 1, wherein the reflectivity $R_1$ is set so as to further satisfy the condition represented by the following formula (5):

$$R_1 \geq 0.3 \tag{5}$$

6. The method of producing a thin film magnetic head according to claim 1: wherein reflectivity $R_2$ for the incident light having a wavelength of 248 nm at an interface between a metal layer located on the uppermost part of the metal layer group and the resist layer is set so as to satisfy the condition represented by the following formula (6); and wherein the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set so as to satisfy the condition represented by the following formula (7):

$$R_2 \geq 0.2 \tag{6}$$

$$D \geq 210\exp(-7.6R_2) \text{ [nm]} \tag{7}$$

7. The method of producing a thin film magnetic head according to claim 1, wherein the resist layer has the refractive index of 1.6 to 1.8 for the incident light with a wavelength of 248 nm and the absorption coefficient of 0 to 0.001.

8. A method of producing a thin film magnetic head, comprising the steps of:
    forming a lower magnetic shield layer on a base;
    forming a magneto-resistance effect layer on the lower magnetic shield layer;
    forming a pair of openings in a predetermined region of the magneto-resistance effect layer;
    forming a pair of bias-applying layers in the pair of openings so that an upper surface thereof may be located above an upper surface of the magneto-resistance effect layer;
    forming a metal layer group by laminating at least one metal layer, which covers an upper surface of the magneto-resistance effect layer located between the pair of bias-applying layers in the magneto-resistance effect layer and an upper surface of the pair of bias-applying layers;
    forming a resist layer across the upper surface of a portion of the metal layer group located above the pair of bias-applying layers and the upper surface of the metal layer group located above the magneto-resistance effect layer of the metal layer group;
    etching a part of the magneto-resistance effect layer and a part of the pair of bias-applying layers with the resist layer being as a mask;
    before removing the resist layer, forming an insulating layer over areas in which the resist layer is not formed; and
    forming an upper magnetic shield layer after removing the resist layer: wherein
    a metal layer located on the uppermost part of the metal layer group is comprised of Ti and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 36.0 nm; or wherein
    a metal layer located on the uppermost part of the metal layer group is comprised of Ta and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 31.2 nm; or wherein
    a metal layer located on the uppermost part of the metal layer group is comprised of W and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 18.0 nm; or wherein
    a metal layer located on the uppermost part of the metal layer group is comprised of NiCr and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 16.7 nm; or wherein
    a metal layer located on the uppermost part of the metal layer group is comprised of Mo and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 8.1 nm; or wherein
    a metal layer located on the uppermost part of the metal layer group is comprised of Ru and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 2.3 nm; or wherein
    a metal layer located on the uppermost part of the metal layer group is comprised of Al and the magnitude D of a step, which is a direct distance between a virtual plane including the upper surface of a portion located above the pair of bias-applying layers of the metal layer group and a virtual plane including the upper surface of a portion located above the magneto-resistance effect layer of the metal layer group, is set to not less than 0.2 nm.

9. A thin film magnetic head having a medium facing surface, comprising:
    an upper magnetic shield layer and a lower magnetic shield layer opposed to each other;
    a magneto-resistance effect element located between the upper magnetic shield layer and the lower magnetic shield layer;

a pair of bias-applying layers which is located between the upper magnetic shield layer and the lower magnetic shield layer and applies a bias magnetic field to the magneto-resistance effect element; and a metal layer group which is located in a region corresponding to the magneto-resistance effect element and the pair of bias-applying layers as seen from a laminating direction, and is formed by laminating at least one metal layer above the magneto-resistance effect element and the pair of bias-applying layers; wherein an upper surface of the pair of bias-applying layers is located closer to the upper magnetic shield layer side than an upper surface of the magneto-resistance effect element; wherein the width of the pair of bias-applying layers in the depth direction relative to the medium facing surface is larger than that of the magneto-resistance effect element in the depth direction relative to the medium facing surface; and wherein the metal layer group is set such that reflectivity $R_3$ for an incident light having a wavelength of 248 nm, the reflectivity being obtained by dividing a total value of a reflected light flux from each metal layer constituting the metal layer group at an interface between the metal layer group and a resist layer, assuming that the resist layer is adjacent onto the metal layer group, by a value of an incident light flux at the interface between the metal layer group and the assumed resist layer, satisfies the condition represented by the following formula (8), and also the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set so as to satisfy the condition represented by the following formula (9):

$$R_3 \geq 0.2 \quad (8)$$

$$D \geq 210\exp(-7.6R_3) \text{ [nm]} \quad (9).$$

10. The thin film magnetic head according to claim 9, wherein the magnitude D of the step is set so as to further satisfy the condition that the magnitude D is not more than ½ of a direct distance between the upper magnetic shield layer and the lower magnetic shield layer.

11. The thin film magnetic head according to claim 9, wherein the magnitude D of the step is set so as to further satisfy the condition represented by the following formula (10):

$$D \leq 45 \text{ [nm]} \quad (10).$$

12. The thin film magnetic head according to claim 11, wherein the magnitude D of the step is set so as to further satisfy the condition represented by the following formula (11):

$$D \leq 20 \text{ [nm]} \quad (11).$$

13. The thin film magnetic head according to claim 9, wherein the reflectivity $R_3$ is set so as to further satisfy the condition represented by the following formula (12):

$$R_3 \geq 0.3 \quad (12).$$

14. The thin film magnetic head according to claim 9: wherein the metal layer group is set such that reflectivity $R_4$ for an incident light having a wavelength of 248 nm at an interface between a metal layer located on the uppermost part of the metal layer group and the assumed resist layer satisfies the condition represented by the following formula (13); and wherein the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set so as to satisfy the condition represented by the following formula (14):

$$R_4 \geq 0.2 \quad (13)$$

$$D \geq 210\exp(-7.6R_4) \text{ [nm]} \quad (14).$$

15. A thin film magnetic head according to claim 9, wherein the assumed resist layer has the refractive index of 1.6 to 1.8 for the incident light with a wavelength of 248 nm and the absorption coefficient of 0 to 0.001.

16. A thin film magnetic head having a medium facing surface, comprising:

an upper magnetic shield layer and a lower magnetic shield layer opposed to each other;

a magneto-resistance effect element located between the upper magnetic shield layer and the lower magnetic shield layer;

a pair of bias-applying layers which is located between the upper magnetic shield layer and the lower magnetic shield layer and applies a bias magnetic field to the magneto-resistance effect element; and a metal layer group which is located in a region corresponding to the magneto-resistance effect element and the pair of bias-applying layers as seen from a laminating direction, and is formed by laminating at least one metal layer above the magneto-resistance effect element and the pair of bias-applying layers; wherein an upper surface of the pair of bias-applying layers is located closer to the upper magnetic shield layer side than an upper surface of the magneto-resistance effect element; wherein a width of the pair of bias-applying layers in the depth direction relative to the medium facing surface is larger than that of the magneto-resistance effect element in the depth direction relative to the medium facing surface; wherein a metal layer located on the uppermost part of the metal layer group is comprised of Ti and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 36.0 nm; or wherein a metal layer located on the uppermost part of the metal layer group is comprised of Ta and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 31.2 nm; or wherein a metal layer located on the uppermost part of the metal layer group is comprised of W and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 18.0 nm; or wherein a metal layer located on the uppermost part of the metal layer group is comprised of NiCr and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 16.7 nm; or wherein a metal layer located on the uppermost part of the metal layer group is comprised of Mo and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 8.1 nm; or wherein a metal layer located on the uppermost part of the metal layer group is comprised of Ru and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 2.3 nm; or wherein a metal layer located on the uppermost part of the metal layer group is comprised of Al and the magnitude D of a step, which is a direct distance between a virtual plane including the upper surface of a portion located above the pair of bias-applying layers of the metal layer group and a virtual plane including the upper surface of a portion located above the magneto-resistance effect element of the metal layer group, is set to not less than 0.2 nm.

* * * * *